United States Patent
Liu et al.

(10) Patent No.: US 8,339,758 B2
(45) Date of Patent: Dec. 25, 2012

(54) TRANSIENT VOLTAGE SUPPRESSOR AND METHOD

(75) Inventors: Mingjiao Liu, Gilbert, AZ (US); Ali Salih, Mesa, AZ (US); Emmanuel Saucedo-Flores, Jalisco CP (MX); Suem Ping Loo, Tolleson, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 743 days.

(21) Appl. No.: 12/113,843

(22) Filed: May 1, 2008

(65) Prior Publication Data

US 2009/0273876 A1    Nov. 5, 2009

(51) Int. Cl.
*H02H 9/04* (2006.01)

(52) U.S. Cl. ........ 361/118; 438/380; 438/514; 438/542; 438/546; 257/105; 257/106; 257/481; 361/56

(58) Field of Classification Search ................. 361/118, 361/56; 261/118; 257/105, 106, 481; 438/380, 438/514, 542, 545, 546, 548, 549
See application file for complete search history.

(56) References Cited

U.S. PATENT DOCUMENTS

| | | | |
|---|---|---|---|
| 5,274,262 A | 12/1993 | Avery | |
| 6,075,276 A * | 6/2000 | Kitamura | 257/481 |
| 6,130,117 A | 10/2000 | Walker et al. | |
| 6,392,266 B1 | 5/2002 | Robb et al. | |
| 6,515,345 B2 | 2/2003 | Robb et al. | |
| 6,867,436 B1 * | 3/2005 | Matteson et al. | 257/106 |
| 7,102,199 B2 | 9/2006 | Robb et al. | |
| 7,440,248 B2 | 10/2008 | Arai et al. | |
| 2004/0125533 A1 | 7/2004 | Tang | |

* cited by examiner

*Primary Examiner* — Jared Fureman
*Assistant Examiner* — Nicholas Ieva
(74) *Attorney, Agent, or Firm* — Rennie William Dover

(57) ABSTRACT

A transient voltage suppressor and a method for protecting against surge and electrostatic discharge events. A semiconductor substrate of a first conductivity type has gate and anode regions of a second conductivity type formed therein. A PN junction diode is formed from a portion of the gate region and the semiconductor substrate. A cathode is formed adjacent to another portion of the gate region. A thyristor is formed from the cathode, the gate region, the substrate, and the anode region. Zener diodes are formed from other portions of the gate region and the semiconductor substrate. A second Zener diode has a breakdown voltage that is greater than a breakdown voltage of a first Zener diode and that is greater than a breakover voltage of the thyristor. The first Zener diode protects against a surge event and the second Zener diode protects against an electrostatic discharge event.

20 Claims, 16 Drawing Sheets

TRANSIENT VOLTAGE SUPPRESSOR AND METHOD

TECHNICAL FIELD

The present invention relates, in general, to semiconductor components and, more particularly, to transient voltage suppressors.

BACKGROUND

Transient voltage suppressors are used in a variety of electrical systems to prevent high voltage transients from damaging system components. For example, computer systems connect transient voltage suppressors across data and/or power lines to dissipate the energy induced by a transient event such as a noise pulse, a static discharge, or a lightning strike. The transient voltage suppressors break down when a transient voltage exceeds a predetermined level, thereby limiting the voltage on the data and power lines and avoiding component damage. A typical transient voltage suppressor breaks down when a transient voltage exceeds a desired voltage and shunts current which would otherwise flow through other system components and lead to a destructive failure of the system.

Transient voltage suppressors typically have two operational states: a high impedance state or a low impedance state with either a low on-voltage or a high on-voltage. When a fast electrostatic discharge ("ESD") event occurs, the transient voltage suppressor is designed to clamp in the on-state with a low impedance and a high on-state voltage. When a high energy surge event occurs, the transient voltage suppressor is designed to operate in the on-state with a low impedance and a low on-voltage. A drawback with transient voltage suppressors is that they are optimized for either protection against an electrostatic discharge event or protection against a surge event. For example, a thyristor surge protection device typically provides good surge capability due to the thyristor having an on-state with a low impedance and a low on-voltage. However, as it has a slow response speed, the response to a short electrostatic discharge event has a large overshoot voltage and the inability to clamp at a desired voltage. A Zener diode, on the other hand, protects against electrostatic discharge events but offers poor surge protection due to its high on-voltage.

Accordingly, it would be advantageous to have a transient voltage suppressor capable of protecting against an electrostatic discharge event and a surge event and a method for protecting against an electrostatic discharge event and a surge event. It would be of further advantage for the device and method to be cost efficient to manufacture.

BRIEF DESCRIPTION OF THE DRAWINGS

The present invention will be better understood from a reading of the following detailed description, taken in conjunction with the accompanying drawing figures, in which like reference characters designate like elements and in which.

DETAILED DESCRIPTION

Figure 1:
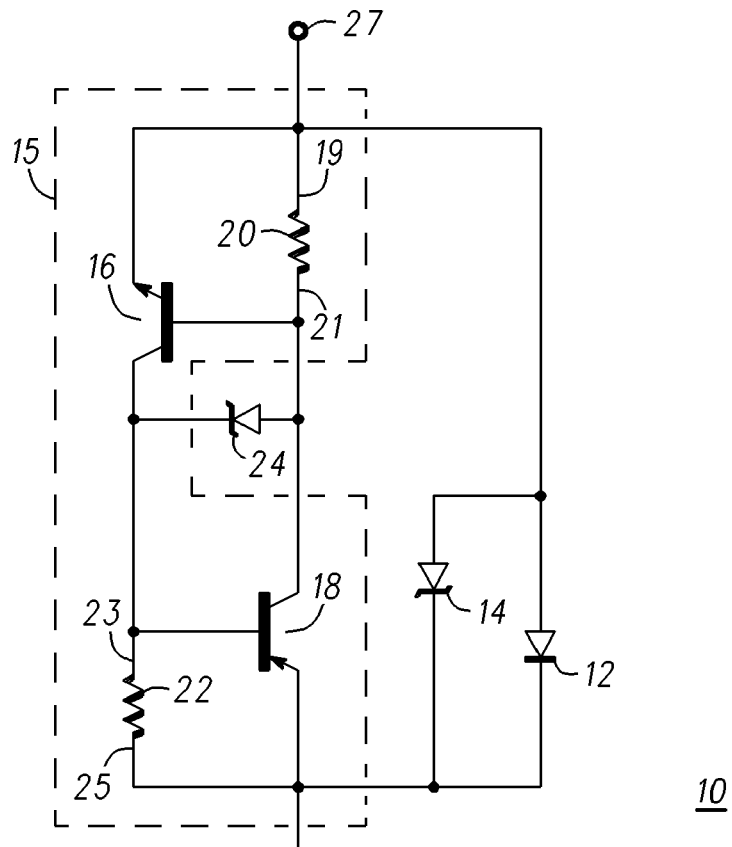
FIG. 1 is a circuit schematic of a transient voltage suppressor in accordance with an embodiment of the present invention.

FIG. 1 is a circuit schematic of a transient voltage suppressor 10 in accordance with an embodiment of the present invention. Transient voltage suppressors are also referred to as transient voltage suppressor devices or transient surge protection devices. Examples of transient voltage suppressors include thyristors, silicon controlled rectifiers (SCRs), triacs, sidacs, diacs, or the like. What is shown in FIG. 1 is an anode terminal of a PN junction diode 12 connected to an anode terminal of a Zener diode 14 and a cathode terminal of the P-N junction diode 12 connected to a cathode terminal of Zener diode 14. Thus, PN junction diode 12 is connected in a parallel configuration with Zener diode 14. It should be noted that PN junction diode 12 is an optional circuit element that may be absent from transient voltage suppressor 10.

A terminal 19 of a resistor 20 is connected to the anode terminals of PN junction diode 12 and Zener diode 14 and a terminal 21 of resistor 20 is connected to the base terminal of an NPN bipolar transistor 16, the cathode of a Zener diode 24, and the collector of a PNP bipolar transistor 18. The emitter of NPN bipolar transistor 16 is connected to the anodes of PN junction diode 12 and Zener diode 14 and to terminal 19 of resistor 20. The collector of NPN bipolar transistor 16, the cathode of Zener diode 24, the base of PNP bipolar transistor 18, and a terminal 23 of a resistor 22 are commonly connected together. A terminal 25 of resistor 22, the emitter of PNP bipolar transistor 18, and the cathode terminals of PN junction diode 12 and Zener diode 14 are commonly connected together. Terminal 19 of resistor 20, the anode terminals of PN junction diode 12 and Zener diode 14, and the emitter of NPN transistor 16 form an input/output node 27 of transient voltage suppressor 10 and terminal 25 of resistor 22, the emitter of PNP bipolar transistor 18, and the cathode terminals of PN junction diode 12 and Zener diode 14 are commonly coupled together and form an input/output node 29 of transient voltage suppressor 10. A bipolar transistor such as an NPN bipolar transistor or a PNP bipolar transistor is also referred to as a bipolar junction transistor. Thus, NPN bipolar transistor 16 may be referred to as an NPN bipolar junction transistor and PNP bipolar transistor 18 may be referred to as a PNP bipolar junction transistor. In addition, the emitter, collector, and base of a bipolar transistor may be referred to as an emitter terminal, a collector terminal, and a base terminal, respectively. Likewise, the anode and cathode of a diode may be referred to as an anode terminal and a cathode terminal, respectively.

Resistors 20 and 22, NPN bipolar transistor 16, and PNP bipolar transistor 18 cooperate to form a thyristor 15. In addition, thyristor 15 may include Zener diode 24. Thus, thyristor 15 is coupled in parallel with Zener diode 14. The emitter terminal of NPN bipolar transistor 16 is connected to terminal 19 of resistor 20 to form a terminal of thyristor 15 which terminal is coupled to the anode of Zener diode 14 to form terminal 27 and the emitter terminal of PNP bipolar transistor 18 is connected to terminal 25 of resistor 22 to form another terminal of thyristor 15, which another terminal is connected to the cathode of Zener diode 14 to form terminal 29.

Figure 2:
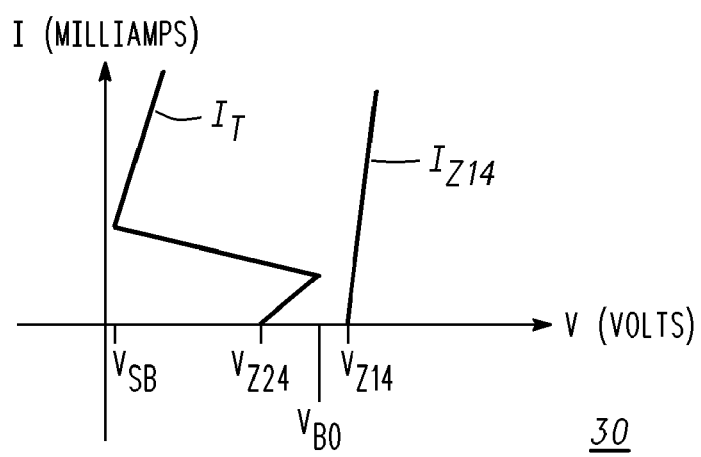
FIG. 2 is a plot of current versus voltage for the transient voltage suppressor of FIG. 1.

Referring now to FIG. 2, a plot 30 of current flowing through transient voltage suppressor 10 versus voltage across transient voltage suppressor 10 is shown. When an electrostatic discharge ("ESD") event occurs, Zener diode 14 becomes activated and begins to conduct a current $I_{Z14}$ at a Zener voltage $V_{Z14}$. Because an electrostatic discharge event occurs very quickly, thyristor 15 may miss the event and may fail to respond to it. Thus, Zener diode 14 responds to the electrostatic discharge event. When a surge event occurs, Zener diode 24 becomes activated and begins to conduct current, $I_T$, at Zener voltage $V_{Z24}$. As the surge voltage continues to increase thyristor 15 becomes activated and conducts current. At a breakdown or breakover voltage $V_{BO}$, the voltage across thyristor 15 snaps back to a snapback voltage $V_{SB}$ and current $I_T$ increases through thyristor 15. Because the breakover voltage of thyristor 15 is less than the Zener voltage of Zener diode 24, thyristor 15 responds to a surge event before Zener diode 14 becomes activated. Thus, thyristor 15 and Zener diode 24 provide protection against a surge event and Zener diode 14 provides protection against an electrostatic discharge event. It should be noted that Zener diode 24 controls the Zener voltage ($V_Z$) and breakover voltage $V_{BO}$ of thyristor 15, i.e., thyristor 15 is triggered by Zener diode 24. When a surge event occurs, Zener diode 24 breaks down and triggers thyristor 15. Zener diode 14, on the other hand, preferably is designed not to break down during a surge event. When an electrostatic discharge ("ESD") event occurs, Zener diodes 14 and 24 respond by breaking down to provide protection, but due to the slow response of thyristor 15, Zener diode 24 does not trigger thyristor 15.

Figure 3:
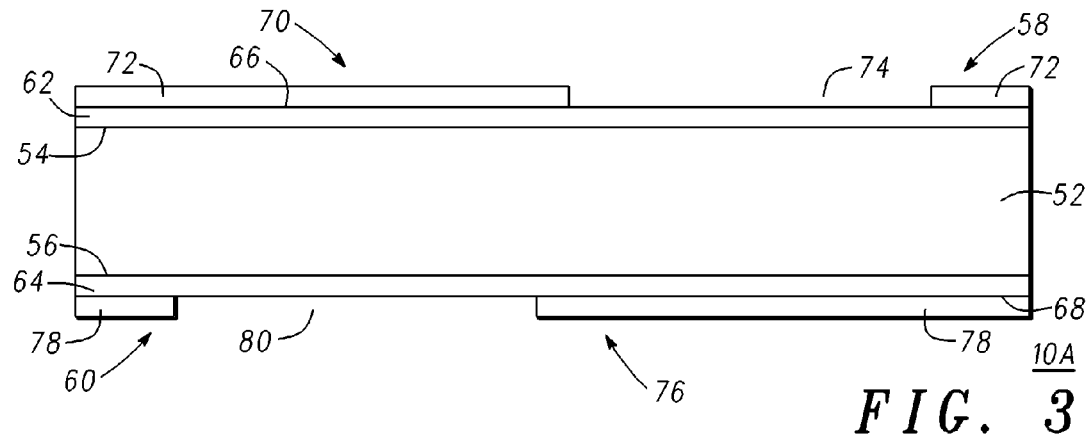
FIG. 3 is a cross-sectional view of a transient voltage suppressor at an early stage of manufacture in accordance with an embodiment of the present invention.

FIG. 3 is a cross-sectional view of a portion of a transient voltage suppressor 10A at an early stage of manufacture in accordance with an embodiment of the present invention. It should be noted that transient voltage suppressor 10A can be represented by the schematic diagram of transient voltage suppressor 10. What is shown in FIG. 3 is a semiconductor substrate 52 having surfaces 54 and 56. Surface 54 is on side 58 of semiconductor substrate 52 and surface 56 is on side 60 of semiconductor substrate 52. Semiconductor substrate 52 has a thickness ranging from about 170 micrometers (about 7 mils) to about 350 micrometers (about 14 mils). In accordance with an embodiment of the present invention, semiconductor substrate 52 has a thickness of about 270 micrometers (about 11 mils), is doped with an impurity material or dopant of N-type conductivity, and has a dopant concentration ranging from about $5\times10^{13}$ atoms per cubic centimeter (atoms/cm$^3$) to about $3\times10^{14}$ atoms/cm$^3$. In other words, the resistivity of semiconductor substrate 52 may range from about 20 Ohm-centimeters (Ω-cm) to about 100 Ω-cm and more particularly from about 45 Ω-cm to about 55 Ω-cm. Suitable dopants of N-type conductivity include phosphorus and arsenic. It should be noted that the type of impurity material and the conductivity type of the impurity material of semiconductor substrate 52 are not limitations of the present invention. Alternatively, semiconductor substrate 52 can be doped with an impurity material of P-type conductivity. It should be understood that when semiconductor substrate 52 is doped with an impurity material of P-type conductivity, the doped regions described hereinbelow would have the opposite conductivity type.

Dielectric layers 62 and 64 are formed on sides 58 and 60, respectively, of semiconductor substrate 52. Preferably, semiconductor substrate 52 is oxidized from sides 58 and 60 to form oxide layers 62 and 64 having surfaces 66 and 68, respectively. However, dielectric layers 62 and 64 are not limited to being oxide. Although the oxidation of semiconductor substrate 52 consumes semiconductor substrate 52 at surfaces 54 and 56, the reference numbers for the surfaces of semiconductor substrate 52 are preserved for the sake of clarity. A layer of photoresist is formed on surface 66 of dielectric layer 62 and a layer of photoresist is formed on surface 68 of dielectric layer 64 using techniques known to those skilled in the art. The photoresist layer on surface 66 is patterned to form an etch mask 70 having masking features 72 and an opening 74 and the photoresist layer on surface 68 is patterned to form an etch mask 76 having masking features 78 and an opening 80. Opening 74 exposes a portion of dielectric layer 62 and opening 80 exposes a portion of dielectric layer 64. Etch masks 70 and 76 are referred to as anode region etch masks.

Figure 4:
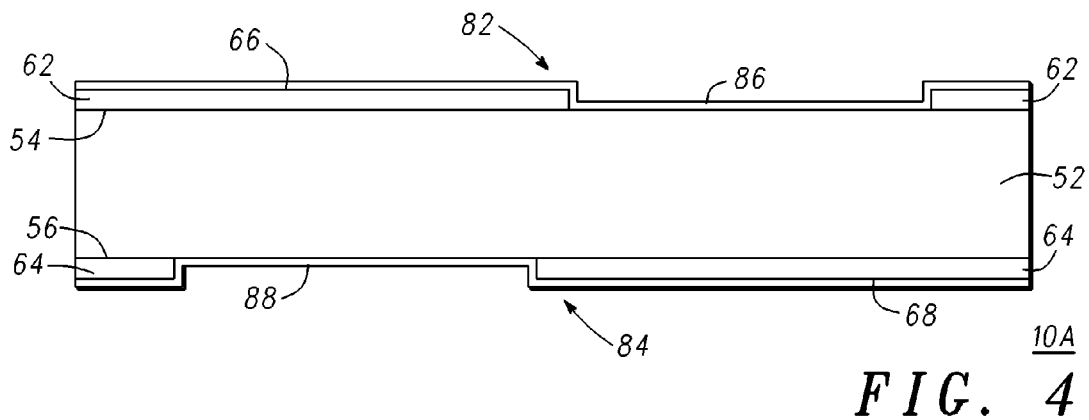
FIG. 4 is a cross-sectional view of the transient voltage suppressor of FIG. 3 at a later stage of manufacture.

Referring now to FIG. 4, the exposed portions of dielectric layers 62 and 64 are anisotropically etched using either a dry etch or a wet etch to expose portions of surfaces 54 and 56. By way of example, the exposed portions of dielectric layers 62 and 64 are etched using hydrofluoric (HF) acid. Etch masks 70 and 76 are removed and the remaining portions of dielectric layers 62 and 64 serve as doping masks or diffusion masks. Although portions 82 and 84 of dielectric layers 62 and 64, respectively, overlap, this is not a limitation of the present invention. In addition, the amount of overlap of portions 82 and 84 is not a limitation of the present invention.

An impurity material of P type conductivity is deposited on the exposed portions of surfaces 54 and 56 of semiconductor substrate 52 to form predeposition layers 86 and 88, respectively. By way of example, the impurity material is boron and is deposited to have a resistivity ranging from about 2 Ohms per square (Ω/square) to about 400 Ω/square. Suitable sources of boron include boron trichloride, diborane, or the like. The technique for disposing the boron on surfaces 54 and 56 is not a limitation of the present invention. It may be deposited, sprayed-on, spun-on, implanted using ion implantation, or the like.

Figure 5:
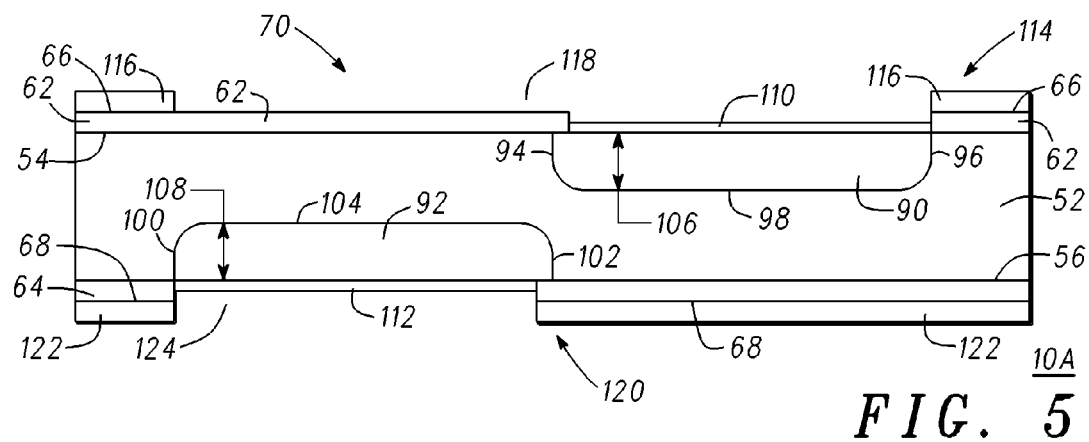
FIG. 5 is a cross-sectional view of the transient voltage suppressor of FIG. 4 at a later stage of manufacture.

Referring now to FIG. 5, the impurity material of predeposition layers 86 and 88 is driven into semiconductor substrate 52 to form doped regions 90 and 92. Doped regions 90 and 92 are also referred to as anode regions. The drive-in is performed for a time ranging from about 20 hours to about 225 hours at a temperature ranging from about 1,250 degrees Celsius (° C.) to about 1,280° C. Doped region 90 extends from surface 54 into semiconductor substrate 52, has lateral boundaries 94 and 96 and a vertical boundary 98, and serves as an anode region of transient voltage suppressor 10A. Doped region 92 extends from surface 56 into semiconductor substrate 52, has lateral boundaries 100 and 102 and a vertical boundary 104, and serves as another anode region of transient voltage suppressor 10A. The distance from surface 54 to vertical boundary 98 represents a junction depth 106 and the distance from surface 56 to vertical boundary 104 represents a junction depth 108. Driving in predeposition layers 86 and 88, i.e., forming doped regions 90 and 92, oxidizes the exposed portions of surfaces 54 and 56 thereby forming oxide or dielectric layers 110 and 112, respectively. Preferably, the thickness of oxide layers 110 and 112 is greater than about 10,000 Angstroms (Å).

A layer of photoresist is formed on surface 66 of dielectric layer 62 and on dielectric layer 110 and a layer of photoresist is formed on surface 68 of dielectric layer 64 and on dielectric layer 112 using techniques known to those skilled in the art. The photoresist layer on surface 66 and oxide layer 110 is patterned to form an etch mask 114 having masking features 116 and an opening 118 and the photoresist layer on surface 68 and oxide layer 112 is patterned to form an etch mask 120 having masking features 122 and an opening 124. Opening 118 exposes a portion of dielectric layer 62 and opening 124 exposes a portion of dielectric layer 64. Openings 118 and 124 may be laterally centered within doped regions 90 and 92 or laterally asymmetric with respect to doped regions 90 and 92. Etch masks 114 and 120 are also referred to as gate region etch masks or gate masking structures.

Figure 6:
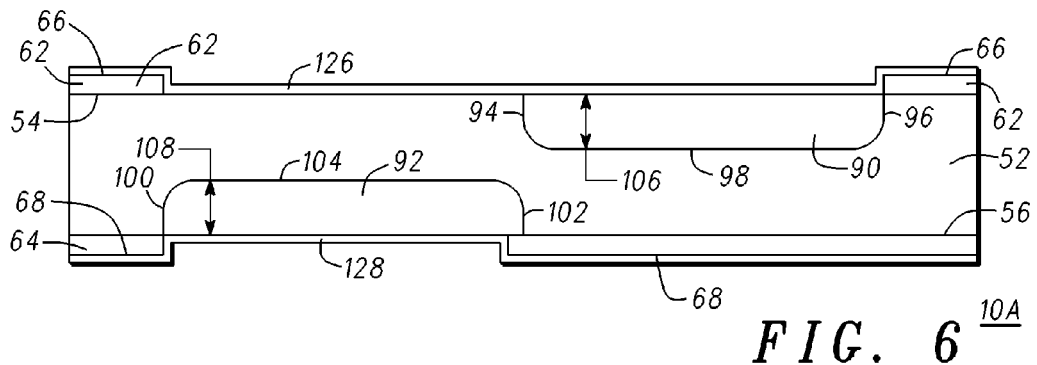
FIG. 6 is a cross-sectional view of the transient voltage suppressor of FIG. 5 at a later stage of manufacture.

Referring now to FIG. 6, the exposed portion of dielectric layers 62 and dielectric layers 110 and 112 are anisotropically etched using either a dry etch or a wet etch to expose portions of surfaces 54 and 56. By way of example, the exposed portions of dielectric layer 62 and dielectric layers 110 and 112 are etched using hydrofluoric (HF) acid. An impurity material of N-type conductivity is deposited on the exposed portions of surfaces 54 and 56 to form predeposition layers 126 and 128, respectively. Predeposition layers 126 and 128 are also referred to as gate predeposition layers because they form gate regions during a subsequent drive-in step. By way of example, the impurity material of predeposition layers 126 and 128 is phosphorus or a phosphorus containing material that is deposited to have a resistivity ranging from about 100 Ω/square to about 1,000 Ω/square. Suitable sources of phosphorus include phosphorus oxytrichloride (POCl$_3$), phosphine (PH$_3$), phosphorus pentaoxide, or the like. The phosphorus can be disposed on surfaces 54 and 56 by ion implantation. Gate region etch masks 114 and 120 are removed.

Figure 7:
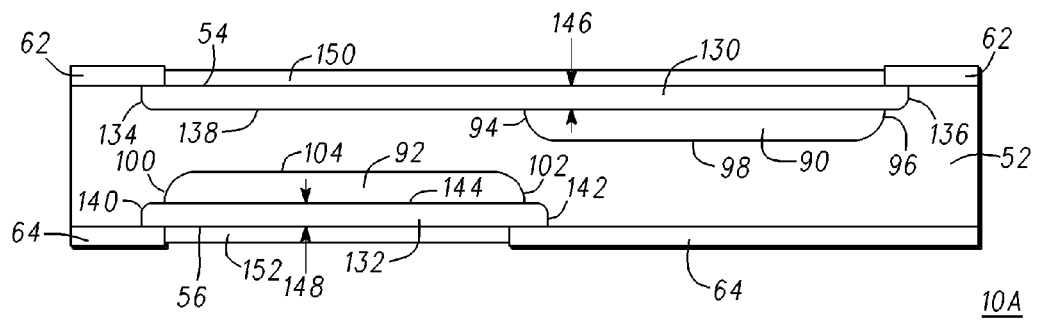
FIG. 7 is a cross-sectional view of the transient voltage suppressor of FIG. 6 at a later stage of manufacture.

Referring now to FIG. 7, the impurity materials of predeposition layers 126 and 128 are driven into semiconductor substrate 52 to form doped regions 130 and 132. Doped regions 130 and 132 are also referred to as gate regions. The drive-in is performed for a time ranging from about 1 hour to about 20 hours at a temperature ranging from about 1,250° C. to about 1,280° C. Doped region 130 extends from surface 54 into semiconductor substrate 52, has lateral boundaries 134 and 136 and a vertical boundary 138, and serves as a gate region of transient voltage suppressor 10A. Doped region 132 extends from surface 56 into semiconductor substrate 52, has lateral boundaries 140 and 142 and a vertical boundary 144, and serves as another gate region of transient voltage suppressor 10A. The distance from surface 54 to vertical boundary 138 represents a diffusion depth 146 and the distance from surface 56 to vertical boundary 134 represents a diffusion depth 148. Driving in predeposition layers 126 and 128, i.e., forming gate regions 130 and 132, oxidizes the exposed portions of surfaces 54 and 56 thereby forming oxide or dielectric layers 150 and 152, respectively. It should be noted that oxide layers 150 and 152 are formed in a dry ambient, thus their thicknesses are less than about 5,000 Å. Oxide layers 150 and 152 are thinner than dielectric layers 62 and 64, respectively. As those skilled in the art are aware, oxidizing a semiconductor material such as silicon consumes portions of the silicon. Accordingly, oxide layers 150 and 152 extend below surfaces 54 and 56, respectively. However, for the sake of clarity surfaces 54 and 56 are shown as being planar, i.e., the bottom surfaces of oxide layers 150 and 152 are shown as being planar.

Figure 8:
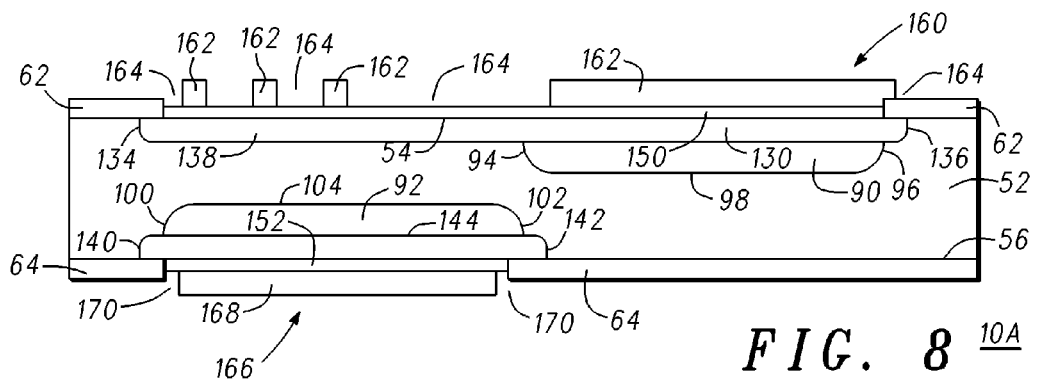
FIG. 8 is a cross-sectional view of the transient voltage suppressor of FIG. 7 at a later stage of manufacture.

Referring now to FIG. 8, a layer of photoresist is formed on dielectric layer 150 and the remaining portions of dielectric layer 62 and a layer of photoresist is formed on dielectric layer 152 and the remaining portions of dielectric layer 64 using techniques known to those skilled in the art. The photoresist layer on dielectric layer 150 and the remaining portions of dielectric layer 62 is patterned to form an etch mask 160 having masking features 162 and openings 164 and the photoresist layer on dielectric layer 152 and the remaining portions of dielectric layer 64 is patterned to form an etch mask 166 having masking features 168 and openings 170. Openings 164 expose portions of dielectric layers 150 and 62 and openings 170 expose portions of dielectric layers 152 and 64.

Figure 9:
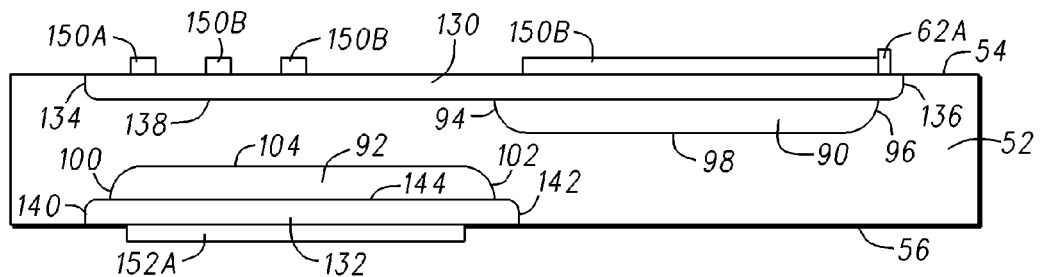
FIG. 9 is a cross-sectional view of the transient voltage suppressor of FIG. 8 at a later stage of manufacture.

Referring now to FIG. 9, the exposed portions of dielectric layers 62, 64, 150, and 152 are anisotropically etched using either a dry etch or a wet etch to expose portions of gate regions 130 and 132. By way of example, the exposed portions of dielectric layers 62, 64, 150, and 152 are etched using hydrofluoric (HF) acid. Etch masks 160 and 166 are removed. Etching dielectric layers 62, 64, 150, and 152 leaves portion 62A of dielectric layer 62, portions 150A and 150B of dielectric layer 150, and portion 152A of dielectric layer 152.

Figure 10:
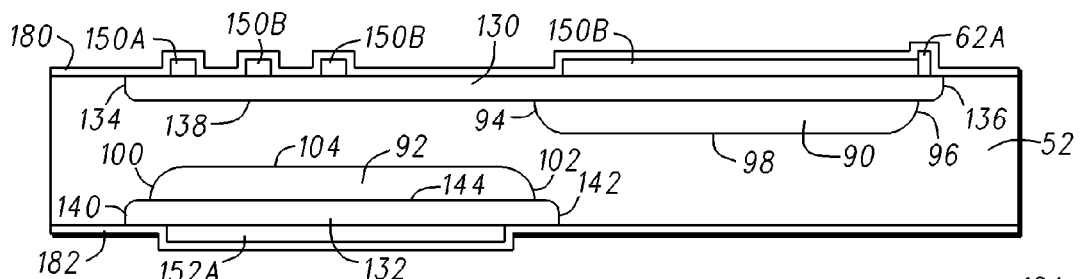
FIG. 10 is a cross-sectional view of the transient voltage suppressor of FIG. 9 at a later stage of manufacture.

Referring now to FIG. 10, an impurity material of N-type conductivity is deposited on the exposed portions of doped region 130, portions 150A and 150B of dielectric layer 150, and portion 62A of dielectric layer 62 to form predeposition layer 180. In addition, the impurity material of N-type conductivity is deposited on the exposed portions of doped region 132 and on portion 152A of dielectric layer 152 to form predeposition layer 182. Predeposition layers 180 and 182 are also referred to as cathode predeposition layers. The impurity material of N-type conductivity is also deposited on the exposed portions of surfaces 54 and 56, thus predeposition layers extend over surfaces 54 and 56, respectively. By way of example, the impurity material is phosphorus or a phosphorus containing material that is deposited to have a resistivity ranging from about 0.25 Ω/square to about 10 Ω/square. Suitable sources of phosphorus include phosphorus oxytrichloride ($POCl_3$), phosphine ($PH_3$), phosphorus pentaoxide, or the like.

Figure 11:
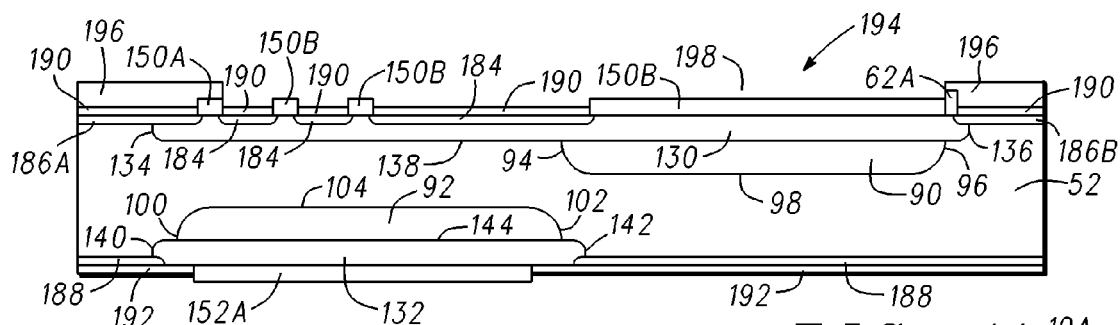
FIG. 11 is a cross-sectional view of the transient voltage suppressor of FIG. 10 at a later stage of manufacture.

Referring now to FIG. 11, the impurity materials of predeposition layers 180 and 182 are driven into gate regions 130 and 132 to form doped regions 184, 186A, 186B, and 188. Doped regions 184 extend from surface 54 into doped region 130, doped regions 186A and 186B extend from surface 54 into doped region 130 and substrate 12, and doped regions 188 extend from surface 56 into doped region 132 and into substrate 12. It should be noted that doped region 186A includes a portion of gate region 130 and a portion of substrate 12 laterally adjacent to lateral boundary 134 of gate region 130 and doped region 186B includes a portion of gate region 130 and a portion of substrate 12 laterally adjacent to lateral boundary 136. The drive-in is performed for a time ranging from about 0.5 hours to about 7 hours at a temperature ranging from about 1,100° C. to about 1,280° C. Doped regions 184, 186A, 186B, and 188 have junction depths that range from about 4 μm to about 10 μm. The drive-in is referred to as a source/soak. The exposed portions of surfaces 54 and 56 are oxidized to form oxide layers 190 from surface 54 and oxide layers 192 from surface 56. By way of example oxide layers 190 and 192 have a thickness ranging from about 2,000 Å to about 7,000 Å and are formed by oxidizing semiconductor substrate 12 for a time ranging from about 15 minutes to about 60 minutes at a temperature ranging from about 970° C. to about 1,280° C. Oxide layers 190 and 192 are thinner than portions 150A and 150B of dielectric layer 150, portion 152A of dielectric layer 152, and portion 62A of dielectric layer 62. As those skilled in the art are aware, oxidizing a semiconductor material such as silicon consumes portions of the silicon. Accordingly, oxide layers 190 and 192 extend below surfaces 54 and 56, respectively. However, for the sake of clarity surfaces 54 and 56 are shown as being planar, i.e., the bottom surfaces of oxide layers 190 and 192 are shown as being planar.

Still referring to FIG. 11, a layer of photoresist is formed on portions 150A and 150B of dielectric layer 150, portion 62A of dielectric layer 62, and on dielectric layer 190 and patterned to form an etch mask 194 having masking features 196 and an opening 198. Opening 198 exposes portions 150B of dielectric layer 150 and portions of dielectric layer 190.

Figure 12:
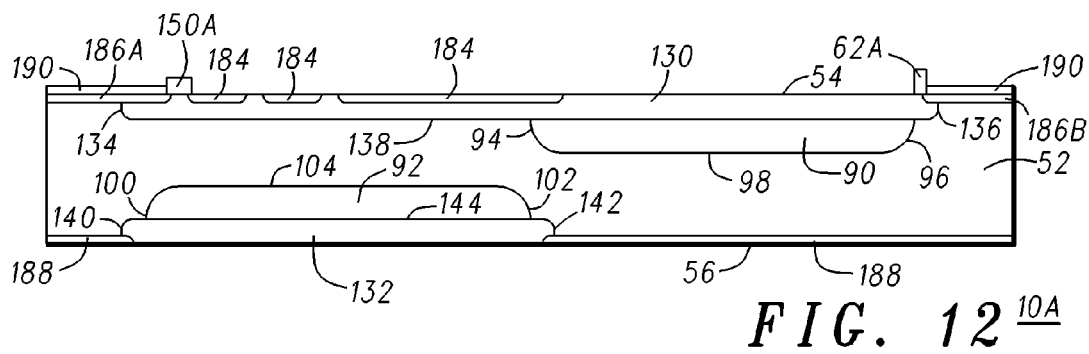
FIG. 12 is a cross-sectional view of the transient voltage suppressor of FIG. 11 at a later stage of manufacture.

Referring now to FIG. 12, exposed portions 150B of dielectric layer 150, the exposed portions of dielectric layer 190, and the exposed portions dielectric layers 152 and 192 are anisotropically etched using either a dry etch or a wet etch to expose portions of surface 54 and portions of surface 56. By way of example, exposed portions 150B of dielectric layer 150, the exposed portions of dielectric layer 190, and the exposed portions 152B dielectric layers 152 and 192 are etched using hydrofluoric (HF) acid. Etch mask 194 is removed. It should be noted that portions 150A and 62A of dielectric layers 150 and 62 remain to prevent metal from contacting doped regions 186A and 186B, respectively.

Alternatively, passivating layers such as, for example, semi-insulating polycrystalline silicon (SIPOS), nitride, oxide, or the like may be formed on portions 150A and 150B of dielectric layer 150, portion 62A of dielectric layer 62, and on dielectric layer 190 rather than forming etch mask 194. The passivating layers are then patterned to expose dielectric layers 150 and 190.

Figure 13:
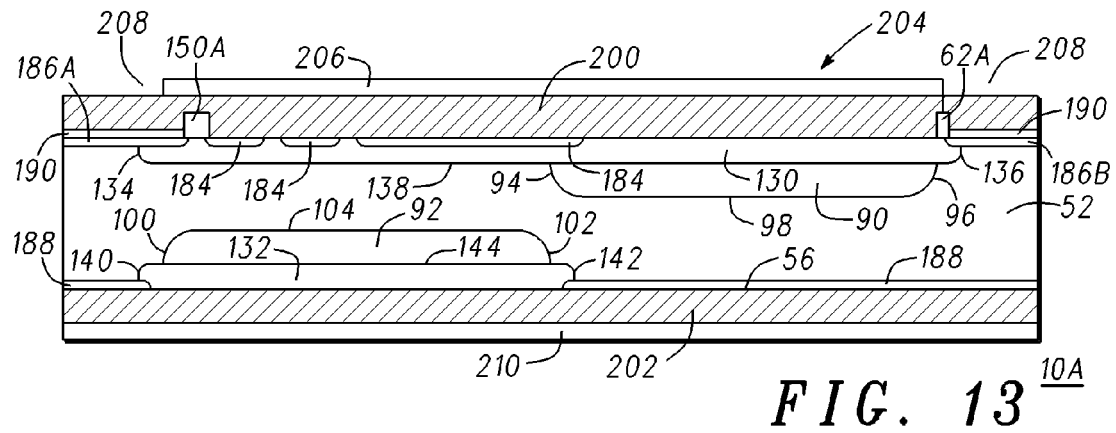
FIG. 13 is a cross-sectional view of the transient voltage suppressor of FIG. 12 at a later stage of manufacture.

Referring now to FIG. 13, a layer of aluminum 200 having a thickness ranging from about one μm to about twenty μm is formed on dielectric layer 90, portion 150A of dielectric layer 150, portion 62A of dielectric layer 62, and the exposed portions of doped regions 130 and 184. In addition, a layer of aluminum 202 having a thickness ranging from about one μm to about twenty μm is formed on doped regions 132 and 188. The aluminum layers may be formed by evaporation followed by sintering or by other techniques known to those skilled in the art. A layer of photoresist is formed on aluminum layer 200 and patterned to form an etch mask 204 having a masking feature 206 and openings 208. Openings 208 expose the portions of aluminum layer 200 over dielectric layer 190 and the portion of aluminum layer 200 over portion 62A of dielectric layer 62. In addition, a layer of photoresist 210 is formed on aluminum layer 202.

Figure 14:
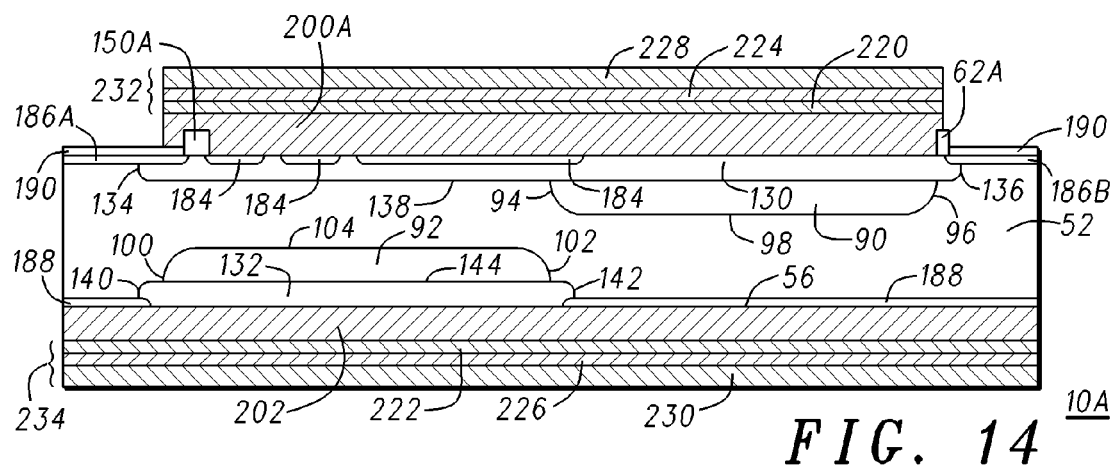
FIG. 14 is a cross-sectional view of the transient voltage suppressor of FIG. 13 at a later stage of manufacture.

Referring now to FIG. 14, the exposed portions of aluminum layer 200 are etched to expose portions of dielectric layers 190 and portion 62A and to form portion 200A of dielectric layer 200. Etch mask 204 and photoresist layer 210 are removed and a layer of titanium 220 having a thickness ranging from about 0.1 μm to about 1 μm is formed on portion 200A of aluminum layer 200 and on the exposed portions of dielectric layer 190 and portion 62A of dielectric layer 62. A layer of titanium 222 having a thickness ranging from about 0.1 µm to about 1 µm is formed on aluminum layer 202. A layer of nitride 224 is formed on titanium layer 220 and a layer of nitride 226 is formed on the titanium layer 222. A layer of silver 228 is formed on nitride layer 224 and a layer of silver 230 is formed on nitride layer 226. Titanium layers 220 and 222, nitride layers 224 and 226, and silver layers 228 and 230 may be formed by evaporation or other techniques known to those skilled in the art. Titanium layer 220, nitride layer 224, and silver layer 228 are patterned to expose portions of dielectric layer 190 and portion 62A and to form a contact structure 232. Titanium layer 222, nitride layer 224, and silver layer 230 form a contact 234.

It should be noted that Zener diode 14 is formed from a portion of gate region 130 and doped region 186B and Zener diode 24 is formed from a portion of gate region 130 and doped region 186A. Thus, Zener diodes 14 and 24 are oriented horizontally respect to surface 54 of semiconductor substrate 52. In accordance with the embodiment of FIG. 13, Zener diode 14 is laterally adjacent gate region 130 and Zener diode 24 is laterally adjacent gate region 130 and cathode regions 184. The breakdown voltage of Zener diode 24 is made lower than that of Zener diode 14 by increasing the boron concentration between doped region 186A and lateral boundary 134.

Figure 15:
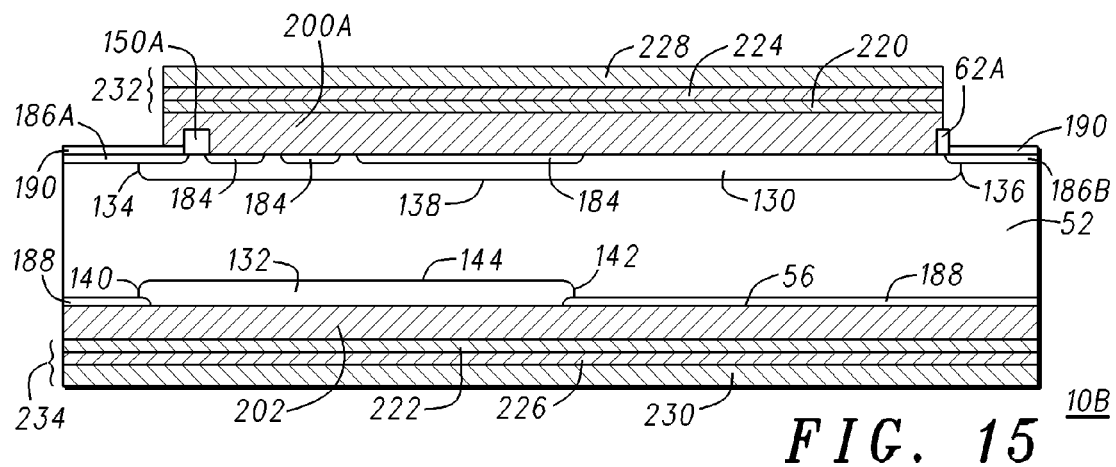
FIG. 15 is a cross-sectional view of a transient voltage suppressor in accordance with another embodiment of the present invention.

FIG. 15 is a cross-sectional view of transient voltage suppressor 10B and a method for manufacturing transient voltage suppressor 10B in accordance with another embodiment of the present invention. It should be noted that transient voltage suppressor 10B can be represented by the schematic diagram of transient voltage suppressor 10. Because the transient voltage suppressor 10B has the same circuit configuration as voltage suppressor 10 of FIG. 1 and 10A of FIG. 14 and a similar method of manufacture as transient voltage suppressor 10A described with reference to FIGS. 3-14, it is identified by reference character 10B. Transient voltage suppressor 10B differs from transient voltage suppressor 10A in that it lacks deep anode doped regions 90 and 92. Thus, the masking, dopant deposition, and dopant drive-in steps described with reference to FIGS. 3-5 are not included in the manufacture of transient voltage suppressor 10B. What is shown in FIG. 15 is semiconductor substrate 52 having surfaces 54 and 56, doped regions 130 and 132, doped regions 184, 186A, 186B, and 188, passivation layers 190, and contacts 232 and 234.

It should be noted that Zener diode 14 is formed from a portion of gate region 130 and doped region 186B and Zener diode 24 is formed from a portion of gate region 130 and doped region 186A. Thus, Zener diodes 14 and 24 are oriented horizontally respect to surface 54 of semiconductor substrate 52. In accordance with the embodiment of FIG. 15, Zener diode 14 is laterally adjacent gate region 130 and Zener diode 24 is laterally adjacent gate region 130 and cathode regions 184.

Figure 16:
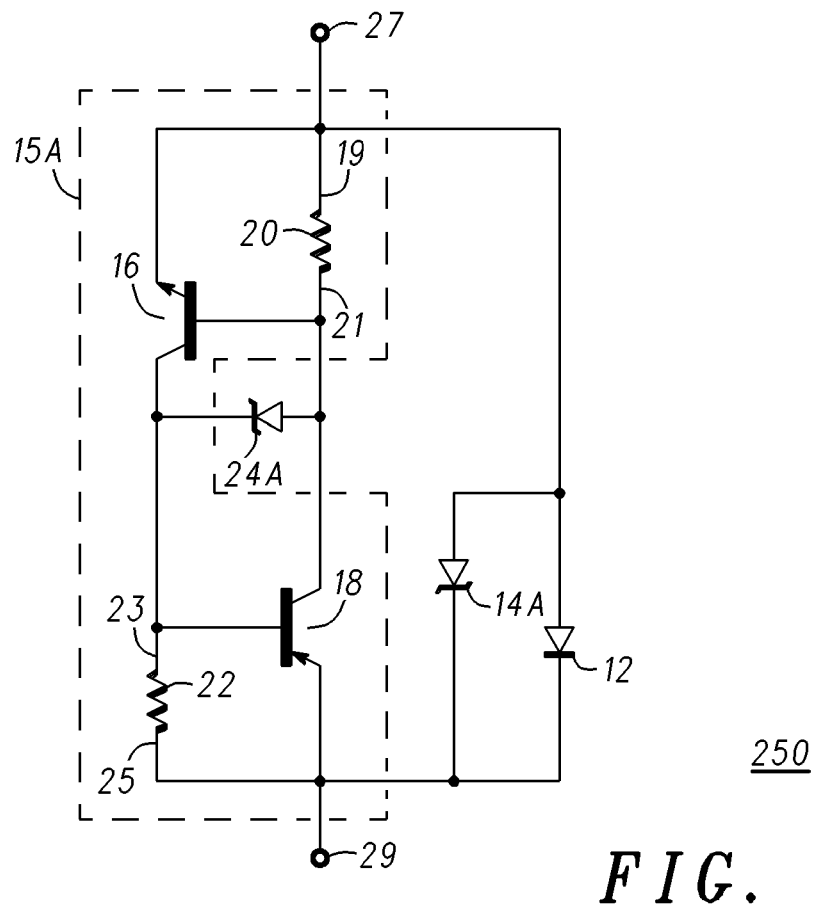
FIG. 16 is a circuit schematic of a transient voltage suppressor in accordance with another embodiment of the present invention.

FIG. 16 is a circuit schematic of a transient voltage suppressor 250 in accordance with another embodiment of the present invention. What is shown in FIG. 16 is an anode terminal of a PN junction diode 12 connected to an anode terminal of a Zener diode 14A and a cathode terminal of P-N junction diode 12 connected to a cathode terminal of Zener diode 14A. Thus, PN junction diode 12 is connected in a parallel configuration with Zener diode 14A. PN junction diode 12 is an optional circuit element that may be absent from transient voltage suppressor 250.

A terminal 19 of a resistor 20 is connected to the anode terminals of PN junction diode 12 and Zener diode 14A and a terminal 21 of resistor 20 is connected to the base of an NPN bipolar transistor 16, the cathode of a Zener diode 24A, and the collector of a PNP bipolar transistor 18. The emitter of NPN bipolar transistor 16 is connected to the anodes of PN junction diode 12 and Zener diode 14A and to terminal 19 of resistor 20. The collector of NPN bipolar transistor 16, the cathode of Zener diode 24A, the base terminal of PNP bipolar transistor 18, and a terminal 23 of a resistor 22 are commonly connected together. A terminal 25 of resistor 22, the emitter of PNP bipolar transistor 18, and the cathode terminals of PN junction diode 12 and Zener diode 14A are commonly connected together. Terminal 19 of resistor 20, the anode terminals of PN junction diode 12 and Zener diode 14A, and the emitter of NPN bipolar transistor 16 form an input/output node 27 of transient voltage suppressor 250 and terminal 25 of resistor 22, the emitter of PNP bipolar transistor 18, and the cathode terminals of PN junction diode 12 and Zener diode 14A are commonly coupled together and form an input/output node 29 of transient voltage suppressor 250. It should be noted that the circuit schematics of transient voltage suppressors 10 and 250 are similar. However, Zener diodes 14 and 24 of transient voltage suppressor 10 are in a horizontal configuration with respect surfaces 54 and 56 (shown in FIG. 3) whereas Zener diodes 14A and 24A are in a vertical orientation with respect to surfaces 54 and 56 (shown in FIG. 21). Thus, the reference character "A" has been appended to the reference characters identifying Zener diodes 14 and 24 to point out that they have a different orientation from Zener diodes 14 and 24 shown in FIG. 1.

Resistors 20 and 22, NPN bipolar transistor 16, and PNP bipolar transistor 18 cooperate to form a thyristor 15A. In addition, thyristor 15A may include Zener diode 24A. Thus, thyristor 15A is coupled in parallel with Zener diode 14A. The emitter terminal of NPN bipolar transistor 16 is connected to terminal 19 of resistor 20 to form a terminal of thyristor 15A which terminal is coupled to the anode of Zener diode 14A to form terminal 27 and the emitter terminal of PNP bipolar transistor 18 is connected to terminal 25 of resistor 22 to form another terminal of thyristor 15A, which another terminal is connected to the cathode of Zener diode 14A to form terminal 29. Like Zener diodes 14A and 24A, the reference character "A" has been appended to the reference character identifying thyristor 15 to point out that Zener diodes 14A and 24A have a different orientation from Zener diodes 14 and 24 shown in FIG. 1

Figure 17:
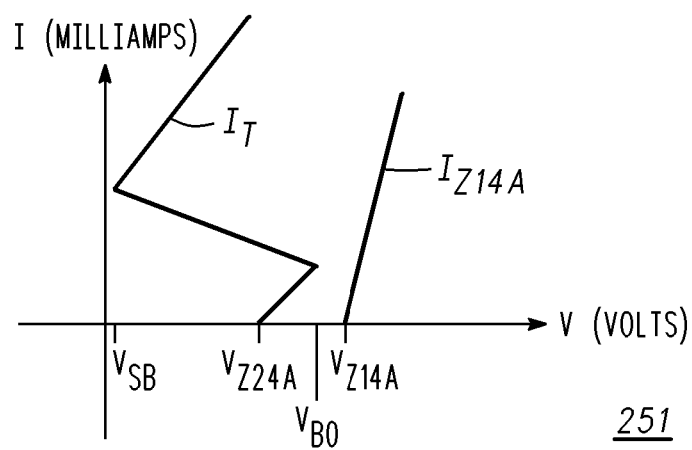
FIG. 17 is a plot of current versus voltage for the transient voltage suppressor of FIG. 16.

Referring now to FIG. 17, a plot 251 of current flowing through transient voltage suppressor 250 versus voltage across transient voltage suppressor 250 is shown. When an electrostatic discharge ("ESD") event occurs, Zener diode 14A becomes activated and begins to conduct a current $I_{Z14A}$ at a Zener voltage $V_{Z14A}$. Because an electrostatic discharge event occurs very quickly, thyristor 15A may miss the event and may fail to respond to it. Thus, Zener diode 14A responds to the electrostatic discharge event. When a surge event occurs, Zener diode 24A becomes activated and begins to conduct current, $I_T$, at Zener voltage $V_{Z2}$. As the surge voltage continues to increase thyristor 15A becomes activated and conducts current. At a breakdown or breakover voltage $V_{BO}$, the voltage across thyristor 15A snaps back to a snapback voltage $V_{SB}$ and current $I_T$ increases through thyristor 15A. Because the breakover voltage of thyristor 15A is less than the Zener voltage of Zener diode 24A, thyristor 15A responds to a surge event before Zener diode 14A becomes activated. Thus, thyristor 15A and Zener diode 24A provide protection against a surge event and Zener diode 14A provides protection against an electrostatic discharge event. It should be noted that Zener diode 24A controls the Zener voltage ($V_Z$)

and breakover voltage $V_{BO}$ of thyristor 15A, i.e., thyristor 15A is triggered by Zener diode 24A. When a surge event occurs Zener diode 24A triggers thyristor 15A and when an electrostatic discharge ("ESD") event, Zener diodes 14A and 24A respond, but due to the slow response of thyristor 15A, Zener diode 24A does not trigger thyristor 15A. When a surge event occurs, Zener diode 24A breaks down and triggers thyristor 15A. Zener diode 14A, on the other hand, preferably is designed not to break down during a surge event. When an electrostatic discharge ("ESD") event occurs, Zener diodes 14A and 24A respond by breaking down to provide protection, but due to the slow response of thyristor 15A, Zener diode 24A does not trigger thyristor 15A.

Figure 18:
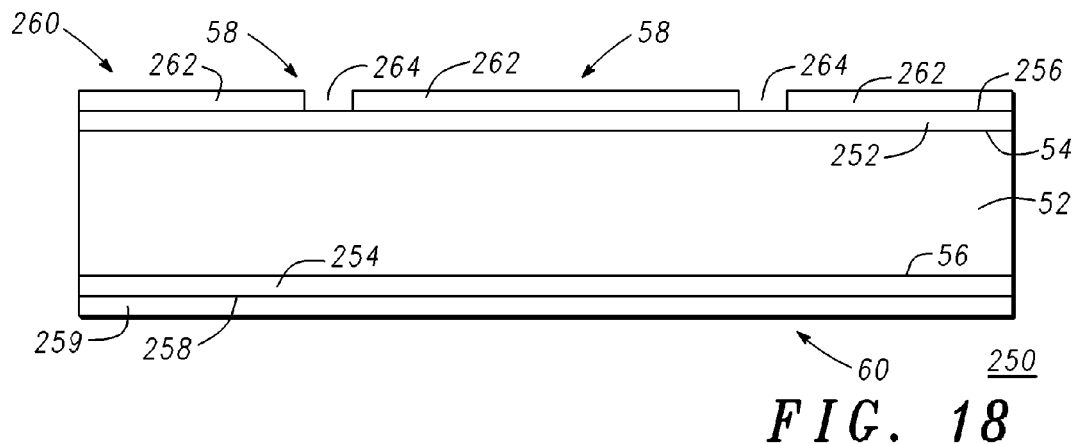
FIG. 18 is a cross-sectional view of a transient voltage suppressor at an early stage of manufacture in accordance with another embodiment of the present invention.

FIG. 18 is a cross-sectional view of a portion of a transient voltage suppressor 250 at an early stage of manufacture in accordance with another embodiment of the present invention. What is shown in FIG. 18 is a semiconductor substrate 52 having surfaces 54 and 56. Semiconductor substrate 52 has been described with reference to FIG. 3. Dielectric layers 252 and 254 are formed on sides 58 and 60, respectively, of semiconductor substrate 52. Preferably, semiconductor substrate 52 is oxidized from sides 58 and 60 to form oxide layers 252 and 254 having surfaces 256 and 258, respectively. However, dielectric layers 252 and 254 are not limited to being oxide. Although the oxidation of semiconductor substrate 52 consumes semiconductor substrate 52 at surfaces 54 and 56, the reference numbers for the surfaces of semiconductor substrate 52 are preserved for the sake of clarity. A layer of photoresist is formed on surface 256 of dielectric layer 252 and a layer of photoresist 259 is formed on surface 258 of dielectric layer 254 using techniques known to those skilled in the art. The photoresist layer on surface 256 is patterned to form an etch mask 260 having masking features 262 and openings 264. Openings 264 expose portions of dielectric layer 252.

Figure 19:
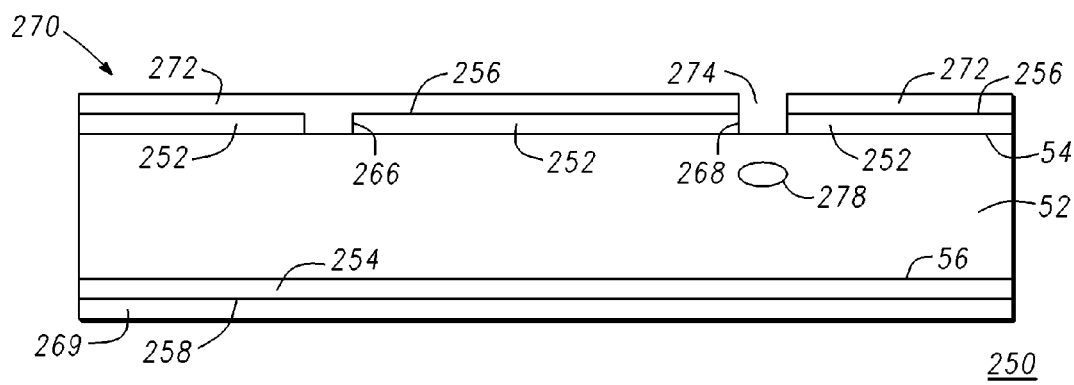
FIG. 19 is a cross-sectional view of the transient voltage suppressor of FIG. 18 at a later stage of manufacture.

Referring now to FIG. 19, the exposed portions of dielectric layer 252 are anisotropically etched using either a dry etch or a wet etch to form openings having sidewalls 266 and 268 that expose portions of surfaces 54 and 56. By way of example, the exposed portions of dielectric layer 252 are etched using hydrofluoric (HF) acid. Etch mask 260 and photoresist layer 259 are removed. A layer of photoresist is formed on surface 256 of dielectric layer 252 and in the openings having sidewalls 266 and 268 and a layer of photoresist 269 is formed on surface 258 of dielectric layer 254 using techniques known to those skilled in the art. The photoresist layer on surface 256 is patterned to form an implant mask 270 having masking features 272 and an opening 274. Opening 274 re-opens the opening having sidewalls 268 and exposes a portion of dielectric layer 252. An impurity material of N-type conductivity is implanted through opening 274 into substrate 52 to form a doped region 278. By way of example, the impurity material is phosphorus or a phosphorus containing material that is implanted at a dose ranging from about $1 \times 10^{13}$ atoms per centimeter squared (atoms/cm$^2$) to about $1 \times 10^{16}$ atoms/cm$^2$ and an implant energy ranging from about 80 kilo-electron Volts (keV) to about 200 keV. Implant mask 270 and photoresist layer 269 are removed.

Figure 20:
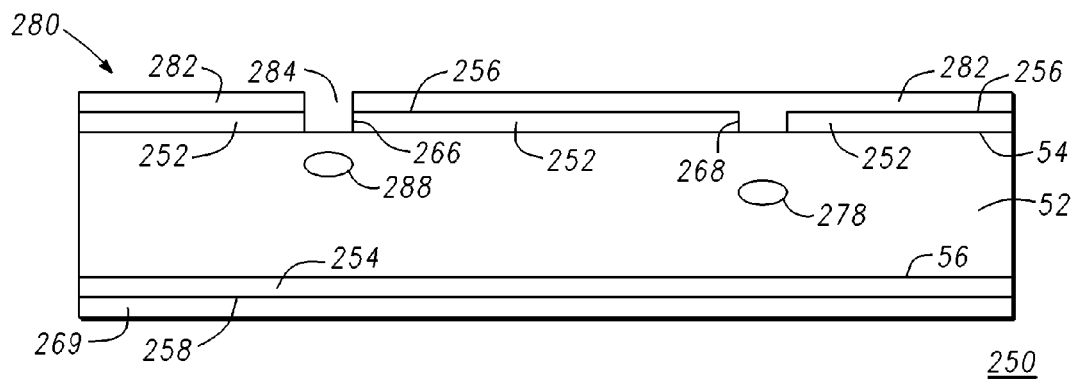
FIG. 20 is a cross-sectional view of a transient voltage suppressor in accordance with another embodiment of the present invention.

Referring now to FIG. 20, a layer of photoresist is formed on surface 256 of dielectric layer 252 and in the openings having sidewalls 266 and 268 and a layer of photoresist 279 is formed on surface 258 of dielectric layer 254 using techniques known to those skilled in the art. The photoresist layer on surface 256 is patterned to form an implant mask 280 having masking features 282 and an opening 284. Opening 284 re-opens the opening having sidewalls 266 and exposes a portion of dielectric layer 252. An impurity material of N-type conductivity is implanted through opening 284 into substrate 52 to form a doped region 288. By way of example, the impurity material is phosphorus or a phosphorus containing material that is implanted at a dose ranging from about $1 \times 10^{13}$ atoms/cm$^2$ to about $1 \times 10^{16}$ atoms/cm$^2$ and an implant energy ranging from about 80 keV to about 200 keV.

Figure 21:
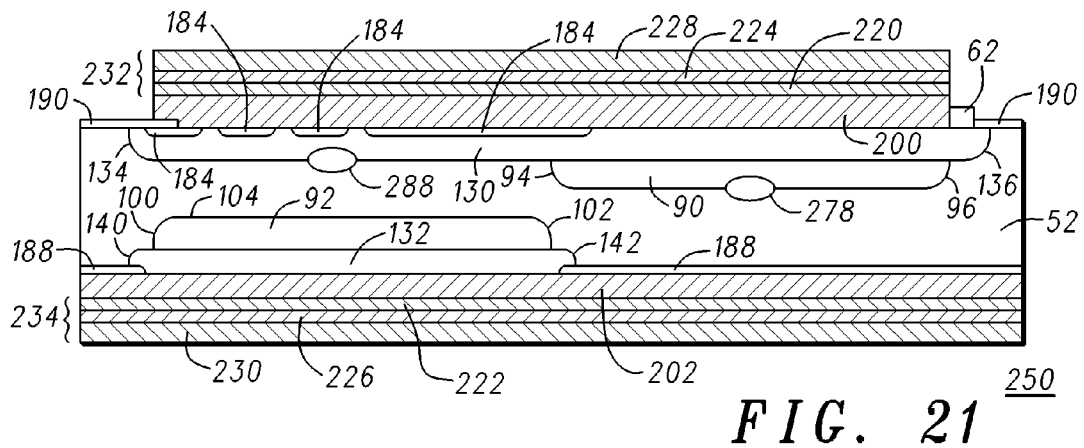
FIG. 21 is a cross-sectional view of the transient voltage suppressor of FIG. 20 at a later stage of manufacture.

Referring now to FIG. 21, implant mask 280 and photoresist layer 279 are removed. In addition, dielectric layers 252 and 254 are also removed to expose surfaces 54 and 56. After the formation of doped regions 278 and 288, the process steps for manufacturing transient voltage suppressor 250 may be similar to those used for manufacturing transient voltage suppressor 10A described with reference to FIGS. 3-14. However, the process steps are different in that etch mask 160 described with reference to FIGS. 8 and 9 include a masking portion that blocks the formation of doped regions 186A and 186B. Thus, when gate region 130 is doped with the impurity of N-type conductivity as described with reference to FIGS. 10 and 11, doped regions 186A and 186B are not formed. It should be noted that doped regions 184 are formed and that doped regions 184 remain within gate region 130. Transient voltage suppressor 250 also differs from transient voltage suppressor 10A in that it includes doped regions 278 and 288 that are not included in transient voltage suppressor 10A. What is shown in FIG. 21 is semiconductor substrate 52 having surfaces 54 and 56, doped regions 90 and 92, doped regions 130 and 132, doped regions 184 and 188, passivation layers 190, contacts 232 and 234, and doped regions 278 and 288.

It should be noted that Zener diode 14A is formed from a portion of gate region 130 and doped region 278 and portions of gate region 130 and anode region 90 and Zener diode 24A is formed from doped region 288 and a portion of gate region 130 that is vertically adjacent to cathode regions 184. Thus, Zener diodes 14A and 24A are vertical respect to surface 54 of semiconductor substrate 52. In accordance with the embodiment of FIG. 21, Zener diode 14A is vertically adjacent to a portion of gate region 130 and Zener diode 24A is vertically adjacent a portion of gate region 130 and cathode regions 184.

Figure 22:
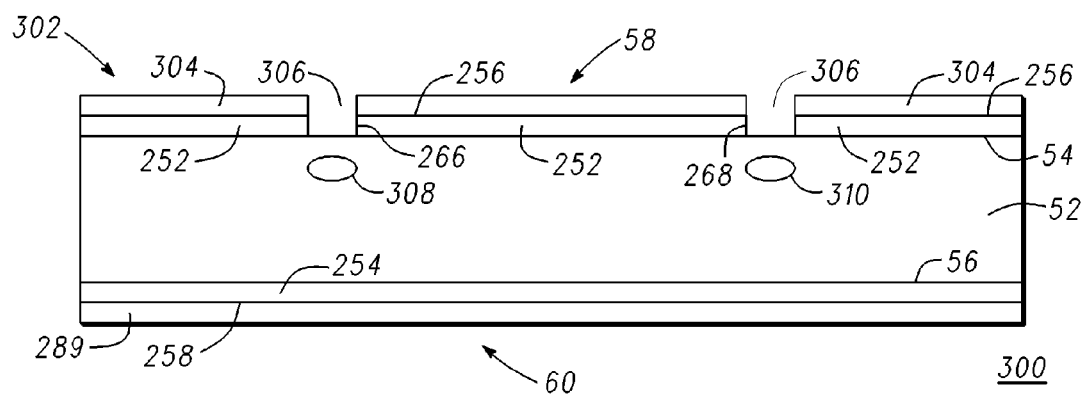
FIG. 22 is a cross-sectional view of a transient voltage suppressor at an early stage of manufacture in accordance with another embodiment of the present invention.

FIG. 22 is a cross-sectional view of a portion of a transient voltage suppressor 300 at an early stage of manufacture in accordance with another embodiment of the present invention. Because Zener diodes 14A and 24A shown in FIG. 16 are similar to those described with reference to FIGS. 22 and 23, reference characters 14A and 24A are preserved in identifying these elements. It should be noted that the difference between transient voltage suppressor 300 and transient voltage suppressor 250 is that transient voltage suppressor 300 lacks deep anode region 90 and that doped region 310 is vertically placed in substrate 52 at a shallower or less deep position than doped region 278 of transient voltage suppressor 250. What is shown in FIG. 22 is a semiconductor substrate 52 having surfaces 54 and 56. Semiconductor substrate 52 has been described with reference to FIG. 3. Dielectric layers 252 and 254 having the openings which have sidewalls 266 and 268 are formed on sides 58 and 60, respectively, of semiconductor substrate 52 and have been described with reference to FIGS. 18 and 19. A layer of photoresist is formed on surface 256 of dielectric layer 252 and in the openings having sidewalls 266 and 268 and a layer of photoresist 289 is formed on surface 258 of dielectric layer 254 using techniques known to those skilled in the art. The photoresist layer on surface 256 is patterned to form an implant mask 302 having masking features 304 and openings 306. Openings 306 re-open the openings having sidewalls 266 and 268 and exposes portions of dielectric layer 252. An impurity material of N-type conductivity is implanted through openings 306 into substrate 52 to form doped regions 308 and 310. By way of example, the impurity material is phosphorus or a phosphorus containing material that is implanted at a dose ranging from about $1 \times 10^{13}$ atoms/cm$^2$ to about $1 \times 10^{16}$ atoms/cm$^2$ and an implant energy ranging from about 80 keV to about 200 keV. Implant mask 302 and photoresist layer 289 are removed.

Figure 23:
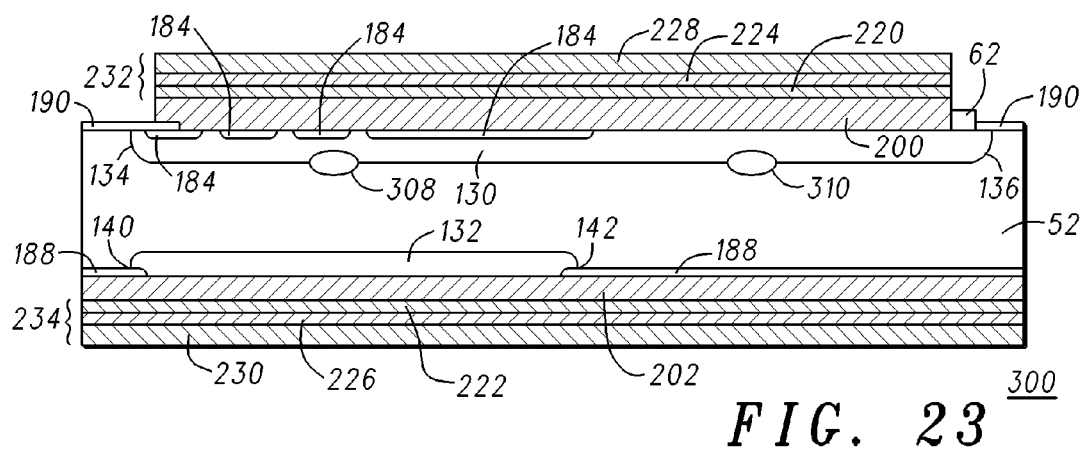
FIG. 23 is a cross-sectional view of the transient voltage suppressor of FIG. 22 at a later stage of manufacture.

FIG. 23 is a cross-sectional view of transient voltage suppressor 300 at a later stage of manufacture. After the formation of doped regions 308 and 310, the process steps for manufacturing transient voltage suppressor 300 may be similar to those used for manufacturing transient voltage suppressor 10A described with reference to FIGS. 3-14. However, the process steps are different in that etch mask 160 described with reference to FIGS. 8 and 9 include a masking portion that blocks the formation of doped regions 186A and 186B. Thus, when gate region 130 is doped with the impurity of N-type conductivity as described with reference to FIGS. 10 and 11, doped regions 186A and 186B are not formed. It should be noted that doped regions 184 are formed and that doped regions 184 remain within gate region 130. Transient voltage suppressor 300 also differs from transient voltage suppressor 10A in that it includes doped regions 308 and 310 that are not included in transient voltage suppressor 10A. What is shown in FIG. 23 is semiconductor substrate 52 having surfaces 54 and 56, doped regions 130 and 132, doped regions 184 and 188, passivation layers 190, contacts 232 and 234, and doped regions 300 and 310.

It should be noted that Zener diode 14A is formed from a portion of gate region 130 and doped region 310 and portions of gate region 130 and anode region 90 and Zener diode 24A is formed from doped region 308 and a portion of gate region 130 that is vertically adjacent to cathode regions 184. Thus, Zener diodes 14A and 24A are vertical respect to surface 54 of semiconductor substrate 52. In accordance with the embodiment of FIG. 21, Zener diode 14A is vertically adjacent to a portion of gate region 130 and Zener diode 24A is vertically adjacent a portion of gate region 130 and cathode regions 184.

Figure 24:
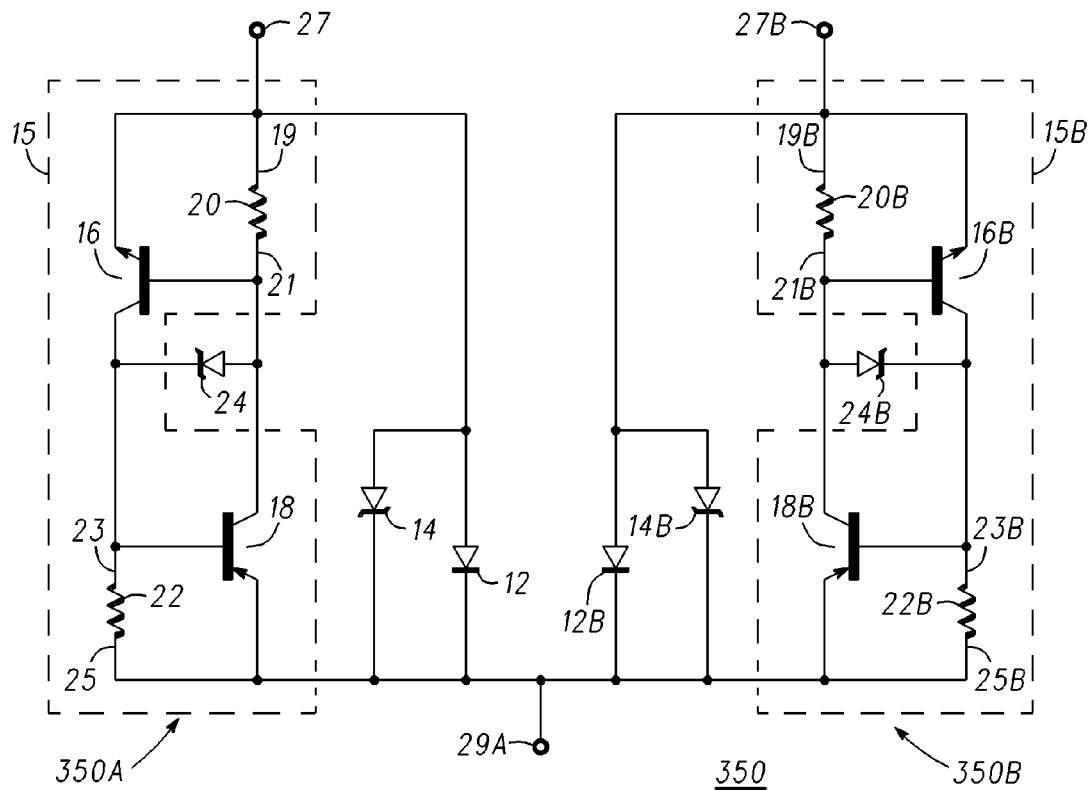
FIG. 24 is a circuit schematic of a transient voltage suppressor in accordance with another embodiment of the present invention.

FIG. 24 is a circuit schematic of a transient voltage suppressor 350 in accordance with another embodiment of the present invention. Transient voltage suppressor 350 is a parallel arrangement comprising transient voltage suppressor 350A and transient voltage suppressor 350B. Transient voltage suppressor 350A comprises an anode terminal of a PN junction diode 12 connected to an anode terminal of a Zener diode 14 and a cathode terminal of the P-N junction diode 12 connected to a cathode terminal of Zener diode 14. Thus, PN junction diode 12 is connected in a parallel configuration with Zener diode 14. A terminal 19 of a resistor 20 is connected to the anode terminals of PN junction diode 12 and Zener diode 14 and a terminal 21 of resistor 20 is connected to the base terminal of an NPN bipolar transistor 16, the cathode of a Zener diode 24, and the collector of a PNP bipolar transistor 18. The emitter of NPN bipolar transistor 16 is connected to the anodes of PN junction diode 12 and Zener diode 14 and to terminal 19 of resistor 20. The collector of NPN bipolar transistor 16, the cathode of Zener diode 24, the base of PNP bipolar transistor 18, and a terminal 23 of a resistor 22 are commonly connected together. A terminal 25 of resistor 22, the emitter of PNP bipolar transistor 18, and the cathode terminals of PN junction diode 12 and Zener diode 14 are commonly connected together. Terminal 19 of resistor 20, the anode terminals of PN junction diode 12 and Zener diode 14, and the emitter of NPN bipolar transistor 16 form an input/output node 27 of transient voltage suppressor 350A and terminal 25 of resistor 22, the emitter of PNP bipolar transistor 18, and the cathode terminals of PN junction diode 12 and Zener diode 14 are commonly coupled together and form an input/output node 29A of transient voltage suppressor 10.

Transient voltage suppressor 350B comprises an anode terminal of a PN junction diode 12B connected to an anode terminal of a Zener diode 14B and a cathode terminal of the P-N junction diode 12B connected to a cathode terminal of Zener diode 14B. Thus, PN junction diode 12B is connected in a parallel configuration with Zener diode 14B. A terminal 19B of a resistor 20B is connected to the anode terminals of PN junction diode 12B and Zener diode 14B and a terminal 21B of resistor 20B is connected to the base terminal of an NPN bipolar transistor 16B, the cathode of a Zener diode 24B, and the collector of a PNP bipolar transistor 18B. The emitter of NPN bipolar transistor 16B is connected to the anodes of PN junction diode 12B and Zener diode 14B and to terminal 19B of resistor 20B. The collector of NPN bipolar transistor 16B, the cathode of Zener diode 24B, the base of PNP bipolar transistor 18B, and a terminal 23B of a resistor 22B are commonly connected together. A terminal 25B of resistor 22B, the emitter of PNP bipolar transistor 18B, and the cathode terminals of PN junction diode 12B and Zener diode 14B are commonly connected together and to terminal 25 of resistor 22, the emitter of PNP bipolar transistor 18, and the cathode terminals of PN junction diode 12 and Zener diode 14. Terminal 19B of resistor 20B, the anode terminals of PN junction diode 12B and Zener diode 14B, and the emitter of NPN bipolar transistor 16B are coupled together to form an input/output node 27B of transient voltage suppressor 350 and terminal 25B of resistor 22B, the emitter of PNP bipolar transistor 18B, and the cathode terminals of PN junction diode 12B and Zener diode 14B are commonly coupled together. Thus, terminal 25B of resistor 22B, the emitter of PNP bipolar transistor 18B, and the cathode terminals of PN junction diode 12B and Zener diode 14B form a portion of input/output node 29A of transient voltage suppressor 350.

Resistors 20 and 22, NPN bipolar transistor 16, and PNP bipolar transistor 18 cooperate to form a thyristor 15. In addition, thyristor 15 may include Zener diode 24. Thus, thyristor 15 is coupled in parallel with Zener diode 14. Thus, the emitter terminal of NPN bipolar transistor 16 is connected to terminal 19 of resistor 20 to form a terminal of thyristor 15 which terminal is coupled to the anode of Zener diode 14 to form terminal 27 and the emitter terminal of PNP bipolar transistor 18 is connected to terminal 25 of resistor 22 to form another terminal of thyristor 15, which another terminal is connected to the cathode of Zener diode 14 to form terminal 29A.

Resistors 20B and 22B, NPN bipolar transistor 16B, and PNP bipolar transistor 18B cooperate to form a thyristor 15B. In addition, thyristor 15B may include Zener diode 24B. Thus, thyristor 15B is coupled in parallel with Zener diode 14B. The emitter terminal of NPN bipolar transistor 16B is connected to terminal 19B of resistor 20B to form a terminal of thyristor 15B which terminal is coupled to the anode of Zener diode 14B to form terminal 27B and the emitter terminal of PNP bipolar transistor 18B is connected to terminal 25B of resistor 22B to form another terminal of thyristor 15B, which another terminal is connected to the cathode of Zener diode 14B to form terminal 29A.

Figure 25:
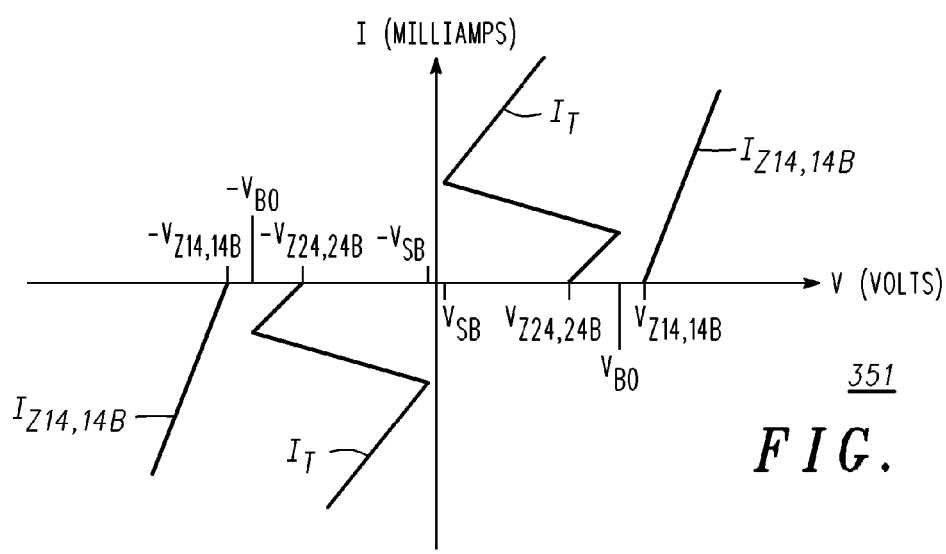
FIG. 25 is a plot of current versus voltage for the transient voltage suppressor of FIG. 24.

Referring now to FIG. 25, a plot 351 of current flowing through transient voltage suppressor 350A versus voltage across transient voltage suppressor 350A is shown. In addition plot 351 is a plot of current flowing through transient voltage suppressor 350B versus voltage across transient voltage suppressor 350B. When an electrostatic discharge ("ESD") event occurs, Zener diode 14 and Zener diode 14B become activated and begin to conduct a currents $I_{Z14,\ 14B}$ at a Zener voltage $V_{Z14,14B}$. Because an electrostatic discharge event occurs very quickly, thyristor 15 and thyristor 15B may miss the event and may fail to respond to it. Thus, Zener diode 14 and Zener diode 14B respond to the electrostatic discharge event. When a surge event occurs, Zener diode 24 and Zener diode 24B become activated and begin to conduct currents, $I_T$, at Zener voltage $V_{Z24,24B}$. As the surge voltage continues to increase thyristor 15 and thyristor 15B become activated and conduct current. At a breakdown or breakover voltage $V_{BO}$, the voltage across thyristor 15 and thyristor 15B snap back to a snapback voltage $V_{SB}$ and currents $I_T$ increase through thyristor 15 and thyristor 15B. Because the breakover voltages of thyristor 15 and thyristor 15B are less than the Zener voltages of Zener diode 24 and Zener diode 24B, thyristor 15 and thyristor 15B respond to a surge event before Zener diode 14 and Zener diode 14B become activated. Thus, thyristor 15 and thyristor 15B and Zener diode 24 and Zener diode 24B provide protection against a surge event and Zener diode 14 and Zener diode 14B provide protection against an electrostatic discharge event.

It should be noted that Zener diode 24 controls the Zener voltage ($V_Z$) and breakover voltage $V_{BO}$ of thyristor 15, i.e., thyristor 15 is triggered by Zener diode 24. When a surge event occurs, Zener diode 24 breaks down and triggers thyristor 15. Zener diode 14, on the other hand, preferably is designed not to break down during a surge event. When an electrostatic discharge ("ESD") event occurs, Zener diodes 14 and 24 respond by breaking down to provide protection, but due to the slow response of thyristor 15, Zener diode 24 does not trigger thyristor 15. Zener diode 24B controls the Zener voltage ($V_Z$) and breakover voltage $V_{BO}$ of thyristor 15B, i.e., thyristor 15B is triggered by Zener diode 24B. When a surge event occurs, Zener diode 24B breaks down and triggers thyristor 15B. Zener diode 14B, on the other hand, preferably is designed not to break down during a surge event. When an electrostatic discharge ("ESD") event occurs, Zener diodes 14B and 24B respond by breaking down to provide protection, but due to the slow response of thyristor 15B, Zener diode 24B does not trigger thyristor 15B.

Figure 26:
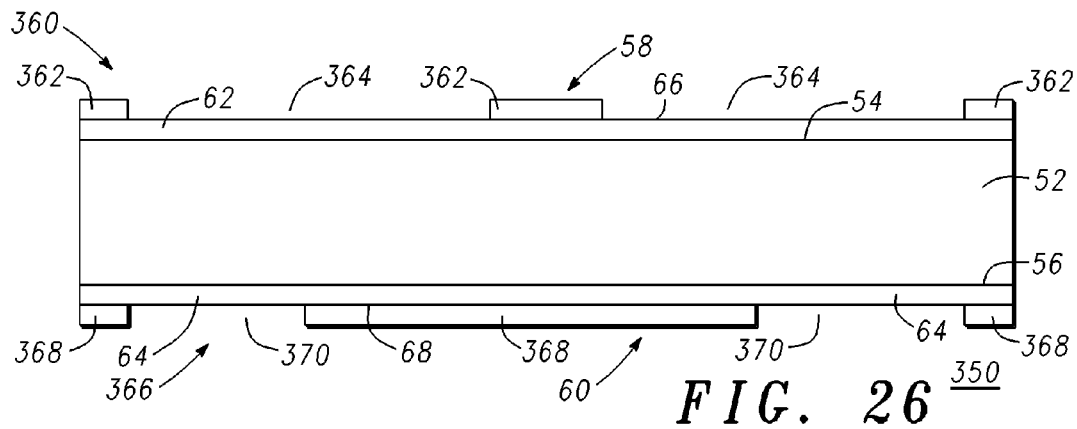
FIG. 26 is a cross-sectional view of the transient voltage suppressor of FIG. 24 at an early stage of manufacture in accordance with an embodiment of the present invention.

FIG. 26 is a cross-sectional view of a portion of a transient voltage suppressor 350 at an early stage of manufacture in accordance with an embodiment of the present invention. What is shown in FIG. 26 is a semiconductor substrate 52 having surfaces 54 and 56 and dielectric layers 62 and 64 formed on surfaces 54 and 56. Semiconductor substrate 52 and dielectric layers 62 and 64 have been described with reference to FIG. 3. A layer of photoresist is formed on surface 66 of dielectric layer 62 and a layer of photoresist is formed on surface 68 of dielectric layer 64 using techniques known to those skilled in the art. The photoresist layer on surface 66 is patterned to form an etch mask 360 having masking features 362 and openings 364 and the photoresist layer on surface 68 is patterned to form an etch mask 366 having masking features 368 and openings 370. Openings 364 expose portions of dielectric layer 62 and openings 370 expose portions of dielectric layer 64.

Figure 27:
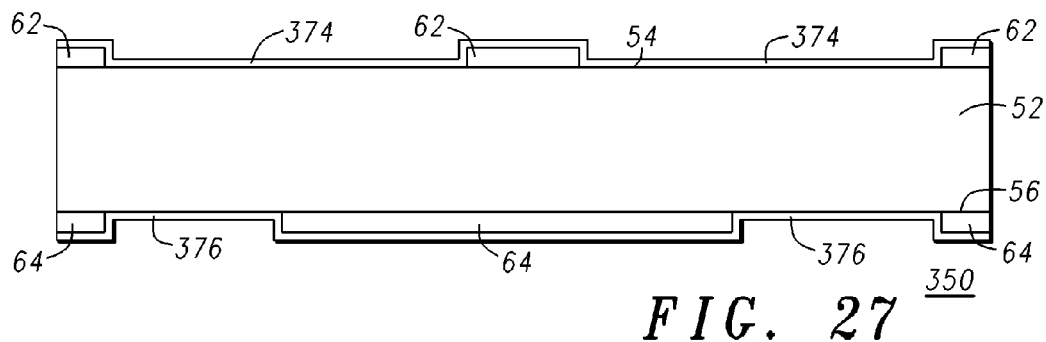
FIG. 27 is a cross-sectional view of the transient voltage suppressor of FIG. 26 at a later stage of manufacture.

Referring now to FIG. 27, the exposed portions of dielectric layers 62 and 64 are anisotropically etched using either a dry etch or a wet etch to expose portions of surfaces 54 and 56. By way of example, the exposed portions of dielectric layers 62 and 64 are etched using hydrofluoric (HF) acid. Etch masks 360 and 366 are removed and the remaining portions of dielectric layers 62 and 64 serve as gate region doping masks or diffusion masks.

An impurity material of P type conductivity is deposited on the exposed portions of surfaces 54 and 56 of semiconductor substrate 52 to form predeposition layers 374 and 376, respectively. By way of example, the impurity material is boron and is deposited to have a resistivity ranging from about 2 Ohms per square ($\Omega$/square) to about 400 $\Omega$/square. Suitable sources of boron include boron trichloride, diborane, or the like. The technique for disposing the boron on surfaces 54 and 56 is not a limitation of the present invention. It may be deposited, sprayed-on, spun-on, implanted using ion implantation, or the like.

Figure 28:
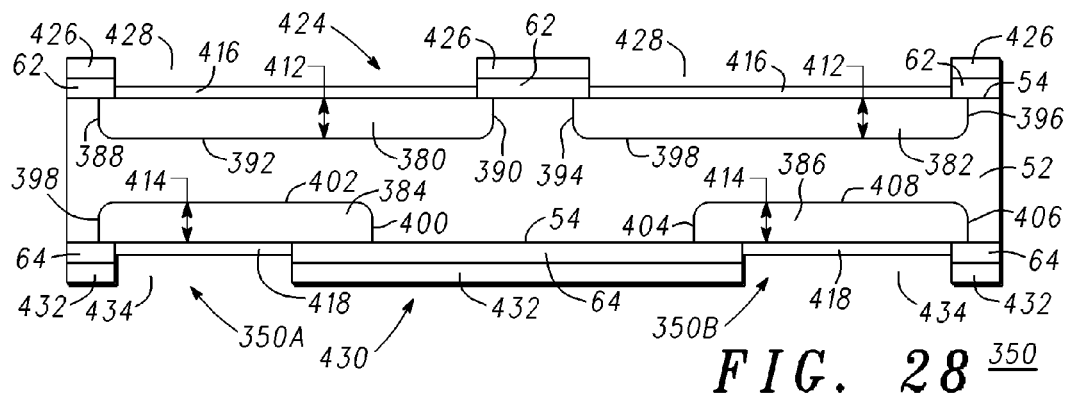
FIG. 28 is a cross-sectional view of the transient voltage suppressor of FIG. 27 at a later stage of manufacture.

Referring now to FIG. 28, the impurity material of predeposition layers 374 and 376 is driven into semiconductor substrate 52 to form doped regions 380 and 382 and the impurity material of predeposition layers 376 is driven into semiconductor substrate 52 to form doped regions 384 and 386. The drive-ins are performed for a time ranging from about 20 hours to about 225 hours at a temperature ranging from about 1,250° C. to about 1,280° C. Doped region 380 extends from surface 54 into semiconductor substrate 52, has lateral boundaries 388 and 390 and a vertical boundary 392, and serves as a gate region of transient voltage suppressor 350A. Doped region 382 extends from surface 54 into semiconductor substrate 52, has lateral boundaries 394 and 396 and a vertical boundary 398, and serves as a gate region of transient voltage suppressor 350B. Doped region 384 extends from surface 56 into semiconductor substrate 52, has lateral boundaries 398 and 400 and a vertical boundary 402, and serves as another gate region of transient voltage suppressor 350A and doped region 386 extends from surface 56 into semiconductor substrate 52, has lateral boundaries 404 and 406, and a vertical boundary 408 and serves as another gate region of transient voltage suppressor 350B. The distance from surface 54 to vertical boundary 392 and from surface 54 to vertical boundary 398 represents a junction depth 412 and the distance from surface 56 to vertical boundary 402 and from surface 56 to vertical boundary 408 represents a junction depth 414. Driving in predeposition layers 374 and 376, i.e., forming doped regions 380, 382, 384, and 386 oxidizes the exposed portions of surfaces 54 and 56 thereby forming oxide or dielectric layers 416 and 418, respectively. The thickness of dielectric layers 416 and 418 is less than the thicknesses of dielectric layers 62 and 64.

A layer of photoresist is formed on the remaining portions of dielectric layer 62 and on dielectric layers 416 and a layer of photoresist is formed on the remaining portions of dielectric layer 64 and on dielectric layers 418 using techniques known to those skilled in the art. The photoresist layer on dielectric layer 62 and dielectric layers 416 is patterned to form an etch mask 424 having masking features 426 and openings 428 and the photoresist layer on surface 68 and oxide layers 418 is patterned to form an etch mask 430 having masking features 432 and openings 434. Openings 428 expose a portion of dielectric layer 62 and openings 434 expose a portion of dielectric layer 64. Etch masks 424 and 430 are also referred to as gate region etch masks or gate region masking structures.

Figure 29:
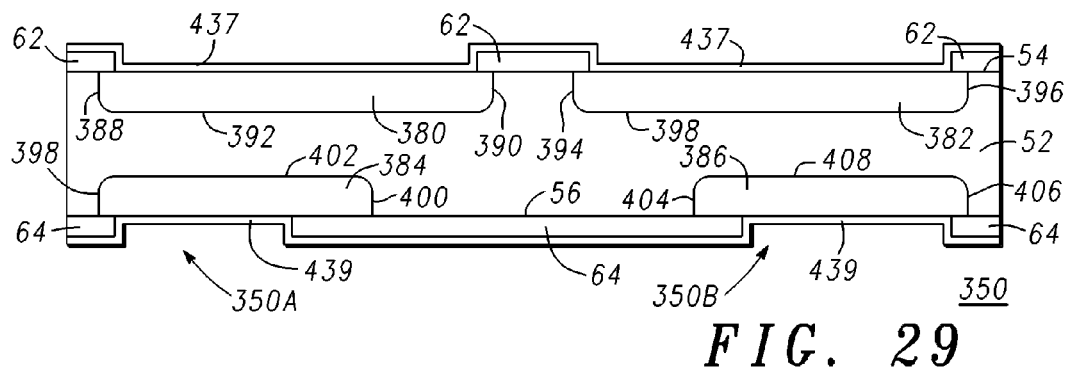
FIG. 29 is a cross-sectional view of the transient voltage suppressor of FIG. 28 at a later stage of manufacture.

Referring now to FIG. 29, the exposed portions of dielectric layers 62 and 64 are anisotropically etched using either a dry etch or a wet etch to expose portions of surfaces 54 and 56. By way of example, the exposed portions of dielectric layers 62 and 64 are etched using hydrofluoric (HF) acid. An impurity material of P type conductivity is deposited on the exposed portions of surfaces 54 and 56 of semiconductor substrate 52 to form predeposition layers 437 and 439, respectively. Predeposition layers 437 and 439 are also referred to as gate enhancement predeposition layers because they enhance the dopant concentrations of gate regions gate regions 380, 382, 384, and 386 during a subsequent drive-in step. By way of example, the impurity material is boron and is deposited to have a resistivity ranging from about 2 Ohms per square (Ω/square) to about 400 Ω/square. Suitable sources of boron include boron trichloride, diborane, or the like. The technique for disposing the boron on surfaces 54 and 56 is not a limitation of the present invention. It may be deposited, sprayed-on, spun-on, implanted using ion implantation, or the like. Gate region enhancement etch masks 424 and 430 are removed.

Figure 30:
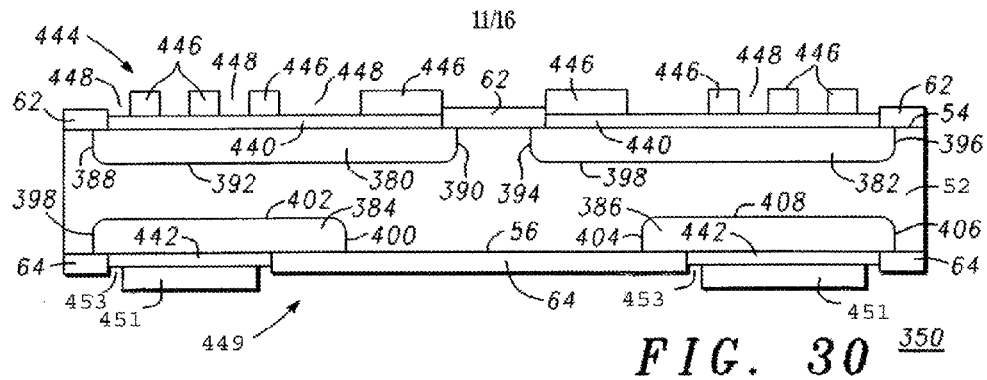
FIG. 30 is a cross-sectional view of the transient voltage suppressor of FIG. 29 at a later stage of manufacture.

Referring now to FIG. 30, the impurity materials of predeposition layers 437 and 439 are driven into gate regions 380, 382, 384, and 386. The drive-in is performed for a time ranging from about 2 hours to about 7 hours at a temperature ranging from about 1,250° C. to about 1,280° C. Because the dopant or impurity materials remain within gate regions 380, 382, 384, and 386 and are of the same conductivity type as gate regions 380, 382, 384, and 386, the reference characters used for identifying the gate regions are preserved. In addition, it should be noted that enhancing the dopant concentration of gate regions 380, 382, 384, and 386 is an optional feature that may be omitted. Driving in predeposition layers 437 and 439, i.e., enhancing the dopant concentration of gate zones 380, 382, 384, and 386, oxidizes the exposed portions of surfaces 54 and 56 thereby forming oxide or dielectric layers 440 and 442. It should be noted that oxide layers 440 and 442 are formed in a dry ambient, thus their thicknesses are about 12,000 Å. Oxide layers 440 and 442 are thinner than the remaining portions of dielectric layers 62 and 64, respectively. As those skilled in the art are aware, oxidizing a semiconductor material such as silicon consumes portions of the silicon. Accordingly, oxide layers 440 and 442 extend below surfaces 54 and 56, respectively. However, for the sake of clarity surfaces 54 and 56 are shown as being planar, i.e., the bottom surfaces of oxide layers 440 and 442 are shown as being planar.

Still referring to FIG. 30, a layer of photoresist is formed on dielectric layers 440 and the remaining portions of dielectric layer 62 and a layer of photoresist is formed on dielectric layers 442 and the remaining portions of dielectric layer 64 using techniques known to those skilled in the art. The photoresist layer on dielectric layers 440 and the remaining portions of dielectric layer 62 is patterned to form an etch mask 444 having masking features 446 and openings 448 and the photoresist layer on dielectric layer 442 and the remaining portions of dielectric layer 64 is patterned to form an etch mask 449 having masking features 451 and openings 453. Openings 448 expose portions of dielectric layers 440 and openings 453 expose portions of dielectric layers 442.

Figure 31:
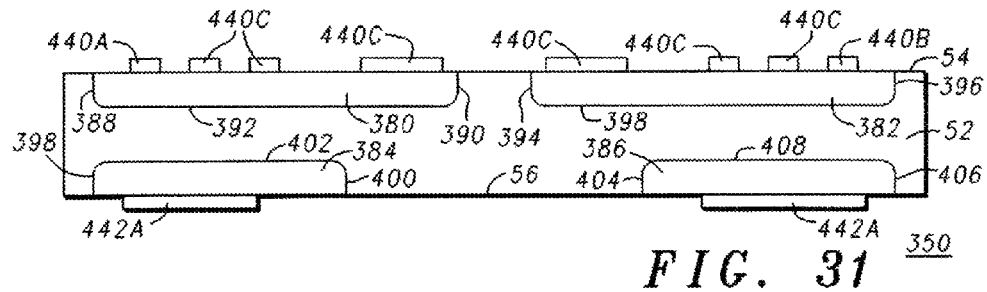
FIG. 31 is a cross-sectional view of the transient voltage suppressor of FIG. 30 at a later stage of manufacture.

Referring now to FIG. 31, the exposed portions of dielectric layers 62, 64, 440, and 442 are anisotropically etched using either a dry etch or a wet etch to expose portions of gate regions 380, 382, 384, and 386. By way of example, the exposed portions of dielectric layers 62, 64, 440, and 442 are etched using hydrofluoric (HF) acid. Etch masks 444 and 450 are removed. Etching dielectric layers 440 and 442 leaves portions 440A, 440B, and 440C of dielectric layer 440 and portions 442A of dielectric layer 442.

Figure 32:
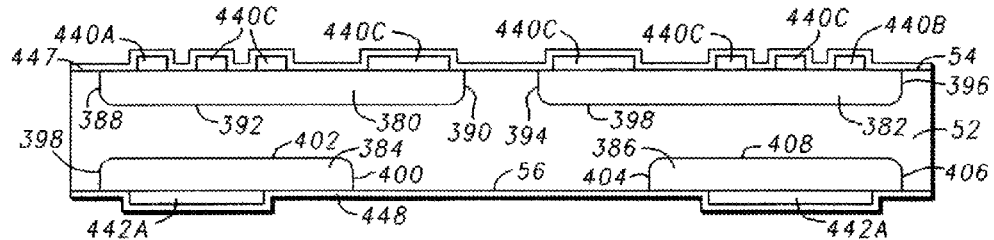
FIG. 32 is a cross-sectional view of the transient voltage suppressor of FIG. 31 at a later stage of manufacture.

Referring now to FIG. 32, an impurity material of N-type conductivity is deposited on portions 440A, 440B, and 440C of dielectric layer 440 and on the exposed portions of doped regions 380 and 382 to form predeposition layer 447 and an impurity material of N-type conductivity is deposited on portions 442A of dielectric layer 442 and on the exposed portions of doped regions 384 and 386 to form predeposition layer 448. Predeposition layers 447 and 448 are also referred to as cathode predeposition layers. The impurity material of N-type conductivity is also deposited on the exposed portions of surfaces 54 and 56, thus cathode predeposition layers 447 and 448 extend over surfaces 54 and 56, respectively. By way of example, the impurity material is phosphorus or a phosphorus containing material that is deposited to have a resistivity ranging from about 0.25 Ω/square to about 10 Ω/square. Suitable sources of phosphorus include phosphorus oxytrichloride (POCl$_3$), phosphine (PH$_3$), phosphorus pentaoxide, or the like.

Figure 33:
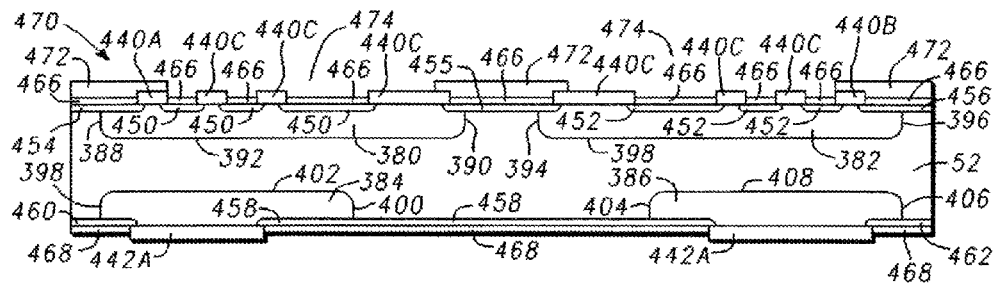
FIG. 33 is a cross-sectional view of the transient voltage suppressor of FIG. 32 at a later stage of manufacture.

Referring now to FIG. 33, the impurity materials of predeposition layer 447 are driven into gate regions 380 and 382 to form doped regions 450, 452, 454, 455, and 456. Doped regions 450 and 452 serve as cathode regions. Doped regions 450 extend from surface 54 into doped region 380, doped regions 452 extend from surface 54 into doped region 382, doped region 454 extends from surface 54 into a portion of doped region 380 and into a portion of substrate 52 that is laterally adjacent to lateral boundary 388, doped region 455 extends from surface 54 into portions of doped regions 380 and 382 and the portion of substrate 52 between doped regions 380 and 382, and doped region 456 extends from surface 54 into a portion of doped region 382 and into a portion of substrate 52 that is laterally adjacent to lateral boundary 396. The impurity materials of predeposition layer 448 are driven into doped regions 384 and 386 and into the portion of substrate 52 between doped regions 384 and 386 to form a doped region 458. In addition, the impurity materials of predeposition layer 448 are driven into a portion of doped region 384 and a portion of substrate 52 that is laterally adjacent to lateral boundary 398 to form a doped region 460 and into a portion of doped region 386 and into a portion of substrate 52 that is laterally adjacent to lateral boundary 406 to form a doped region 462. The drive-in is performed for a time ranging from about 0.5 hours to about 7 hours at a temperature ranging from about 1,100° C. to about 1,280° C. Doped regions 450, 452, 454, 455, 456, 458, 460, and 462 have junction depths ranging from about 4 μm to about 10 μm. The drive-in is also referred to as a source/soak. The exposed portions of surfaces 54 and 56 are oxidized to form oxide layers 466 from surface 54 and oxide layers 468 from surface 56. By way of example oxide layers 466 and 468 have a thickness ranging from about 2,000 Å to about 7,000 Å and are formed by oxidizing semiconductor substrate 52 for a time ranging from about 15 minutes to about 60 minutes at a temperature ranging from about 970° C. to about 1,280° C. Oxide layers 466 and 468 are thinner than portions 440A, 440B, and 440C of dielectric layer 440 and portions 442A of dielectric layer 442. As those skilled in the art are aware, oxidizing a semiconductor material such as silicon consumes portions of the silicon. Accordingly, oxide layers 466 and 468 extend below surfaces 54 and 56, respectively. However, for the sake of clarity surfaces 54 and 56 are shown as being planar, i.e., the bottom surfaces of oxide layers 466 and 468 are shown as being planar.

Still referring to FIG. 33, a layer of photoresist is formed on dielectric layer 466 and on portions 440A, 440B, and 440C of dielectric layer 440. The layer of photoresist formed on dielectric layer 466 and on portions 440A, 440B, and 440C of dielectric layer 440 is patterned to form an etch mask 470 having masking features 472 and openings 474. Openings 474 expose portions of dielectric layer 466 and portions 440C of dielectric layer 440.

Figure 34:
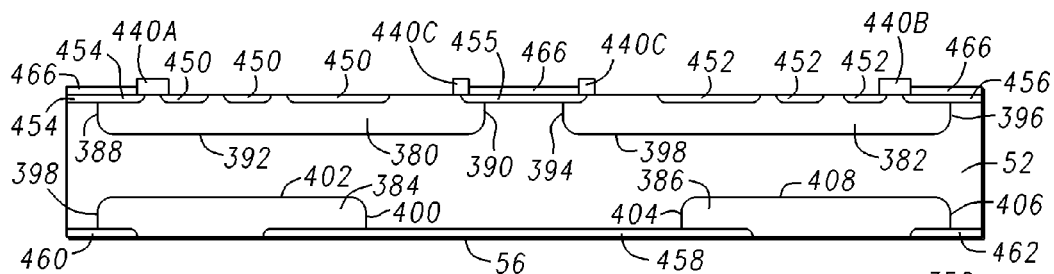
FIG. 34 is a cross-sectional view of the transient voltage suppressor of FIG. 33 at a later stage of manufacture.

Referring now to FIG. 34, the exposed portions of dielectric layer 466 and portions 440C of dielectric layer 440 and the exposed portions dielectric layer 468 and portion 442A are anisotropically etched using either a dry etch or a wet etch to expose portions of surface 54 and portions of surface 56. By way of example, the exposed portions of dielectric layer 466 and portions 440C of dielectric layer 440 and the exposed portions dielectric layer 468 and portion 442A are etched using hydrofluoric (HF) acid. Etch mask 470 is removed. It should be noted that portions 440A and 440B of dielectric layer 440 remain to prevent metal from contacting doped regions 454 and 456, respectively.

Alternatively, passivating layers such as, for example, semi-insulating polycrystalline silicon (SIPOS), nitride, oxide, or the like may be formed on the portions of dielectric layer 466 and portions 440A, 440B, and 440C of dielectric layer 440. The passivating layers are then patterned to expose portions of dielectric layer 466 and portions 440A, 440B, and 440C of dielectric layer 440.

Figure 35:
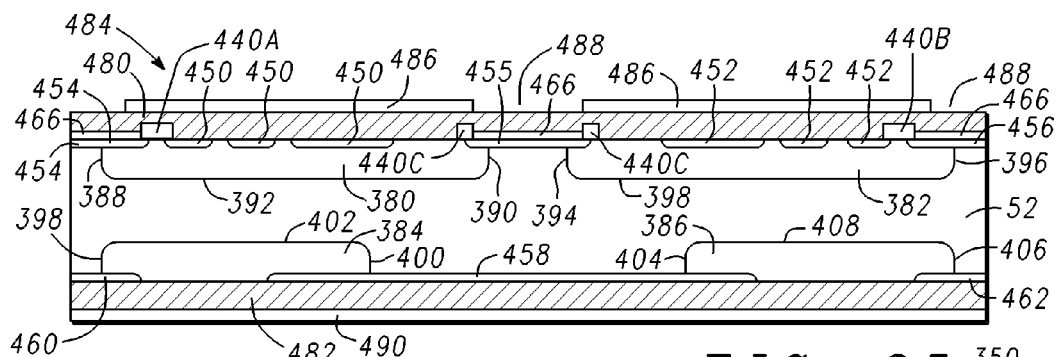
FIG. 35 is a cross-sectional view of the transient voltage suppressor of FIG. 34 at a later stage of manufacture.

Referring now to FIG. 35 a layer of aluminum 480 having a thickness ranging from about one μm to about twenty μm is formed on the dielectric layers 466, portions 440A and 440B of dielectric layer 440, and the exposed portions of doped regions 380, 382, 450, and 452. In addition, a layer of aluminum 482 having a thickness ranging from about one μm to about twenty μm is formed on doped regions 384, 386, 458, 460, and 462. The aluminum layers may be formed by evaporation followed by sintering or by other techniques known to those skilled in the art. A layer of photoresist is formed on aluminum layer 480 and patterned to form an etch mask 484 having masking features 486 and openings 488. Openings 488 expose the portions of aluminum layer 200 over dielectric layers 466. In addition, a layer of photoresist 490 is formed on aluminum layer 482.

Figure 36:
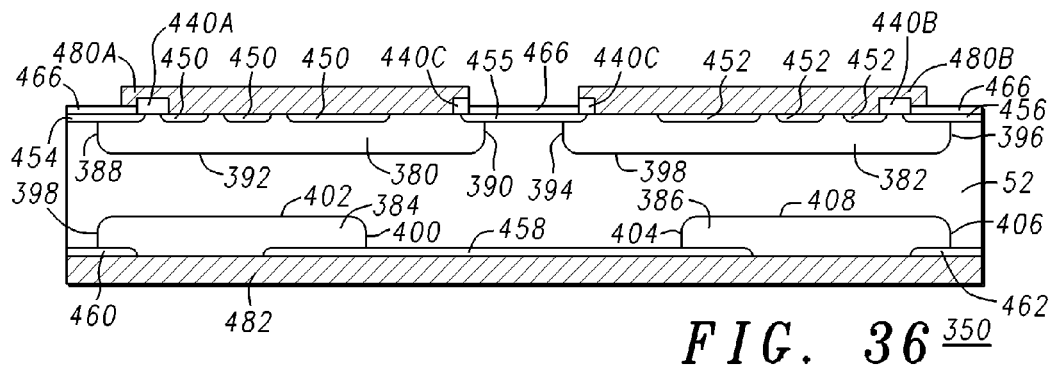
FIG. 36 is a cross-sectional view of the transient voltage suppressor of FIG. 35 at a later stage of manufacture.

Referring now to FIG. 36, the exposed portions of aluminum layer 480 are etched to expose portions of dielectric layers 466 and divide aluminum layer 480 into portions 480A and 480B. Etch mask 484 and photoresist layer 490 are removed.

Figure 37:
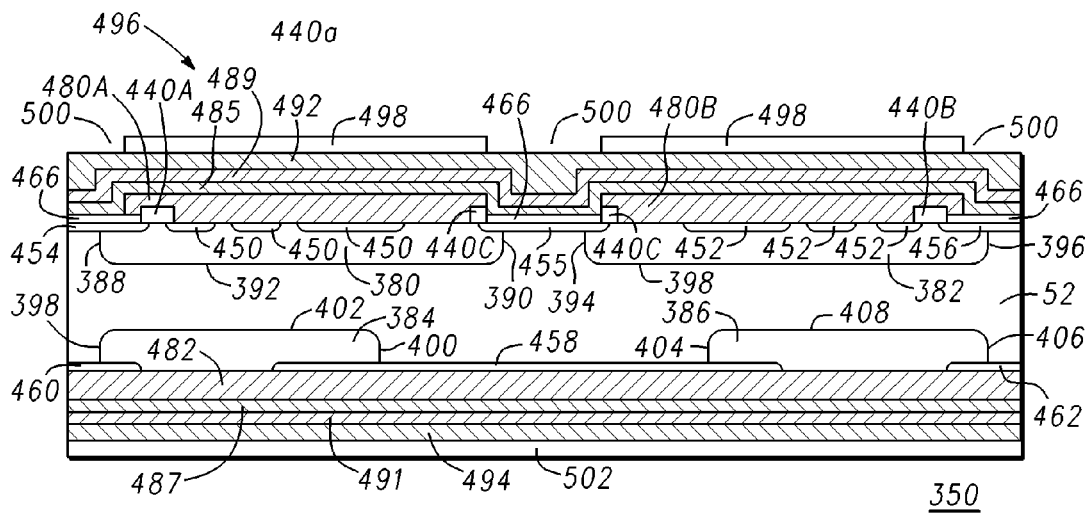
FIG. 37 is a cross-sectional view of the transient voltage suppressor of FIG. 36 at a later stage of manufacture.

Referring now to FIG. 37, a layer of titanium 485 having a thickness ranging from about 0.1 μm to about 1 μm is formed on portions 480A and 480B of aluminum layer 480 and on the exposed portions of dielectric layers 466. A layer of titanium 487 having a thickness ranging from about 0.1 μm to about 1 μm is formed on aluminum layer 482. A layer of nitride 489 is formed on titanium layer 485 and a layer of nitride 491 is formed on the titanium layer 487. A layer of silver 492 is formed on nitride layer 489 and a layer of silver 494 is formed on nitride layer 491. Titanium layers 485 and 487, nitride layers 489 and 491, and silver layers 492 and 494 may be formed by evaporation or other techniques known to those skilled in the art.

A layer of photoresist is formed on silver layer 492 and patterned to form a masking structure 496 having masking features 498 and openings 500 that expose portions of silver layer 492. A layer of photoresist 502 is formed on silver layer 494.

Figure 38:
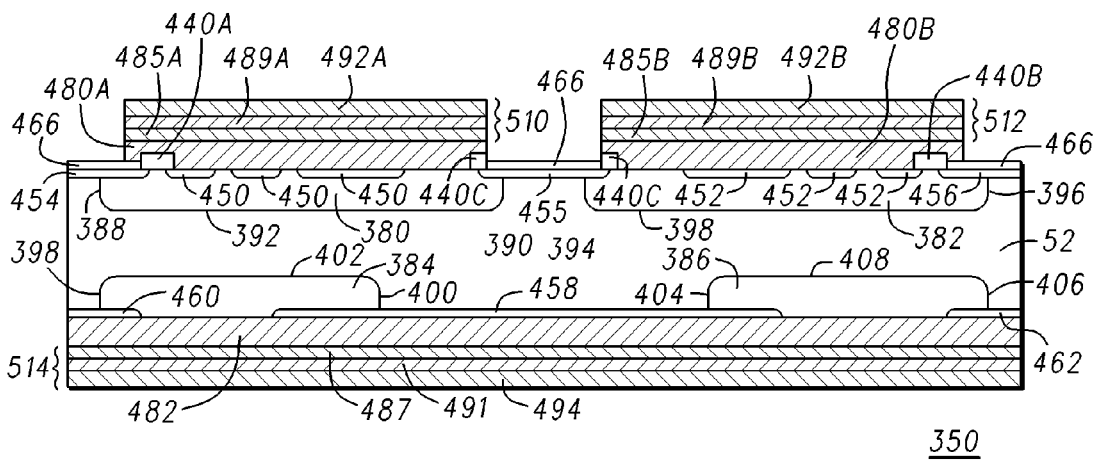
FIG. 38 is a cross-sectional view of the transient voltage suppressor of FIG. 37 at a later stage of manufacture.

Referring now to FIG. 38, the exposed portions of silver layer 492 are etched and the portions of nitride layer 489 and titanium layer 485 under the exposed portions of silver layer 492 are anisotropically etched leaving portions 492A and 492B of silver layer 492, portions 489A and 489B of nitride layer 488, and portions 485A and 485B of titanium layer 484. Silver portion 492A, nitride portion 489A, and titanium portion 485A form a contact 510 and silver portion 492B, nitride portion 489B, and titanium portion 485B form a portion of a contact 512. Silver layer 494, nitride layer 491, and titanium layer 487 form a portion of a contact 514.

It should be noted that Zener diode 14 is formed from a portion of gate region 380 and a portion of doped region 455 and Zener diode 24 is formed from a portion of gate region 380 and a portion of doped region 454. Thus, Zener diodes 14 and 24 are oriented horizontally with respect to surface 54 of semiconductor substrate 52. In accordance with the embodiment of FIG. 38, Zener diode 14 is laterally adjacent gate region 380 and Zener diode 24 is laterally adjacent gate region 380 and cathode regions 450. Zener diode 14B is formed from a portion of gate region 382 and a portion of doped region 455 and Zener diode 24B is formed from a portion of gate region 382 and a portion of doped region 456. Thus, Zener diodes 14B and 24B are oriented horizontally with respect to surface 54 of semiconductor substrate 52. In accordance with the embodiment of FIG. 38, Zener diode 14B is laterally adjacent gate region 382 and Zener diode 24B is laterally adjacent gate region 382 and cathode regions 452.

Figure 39:
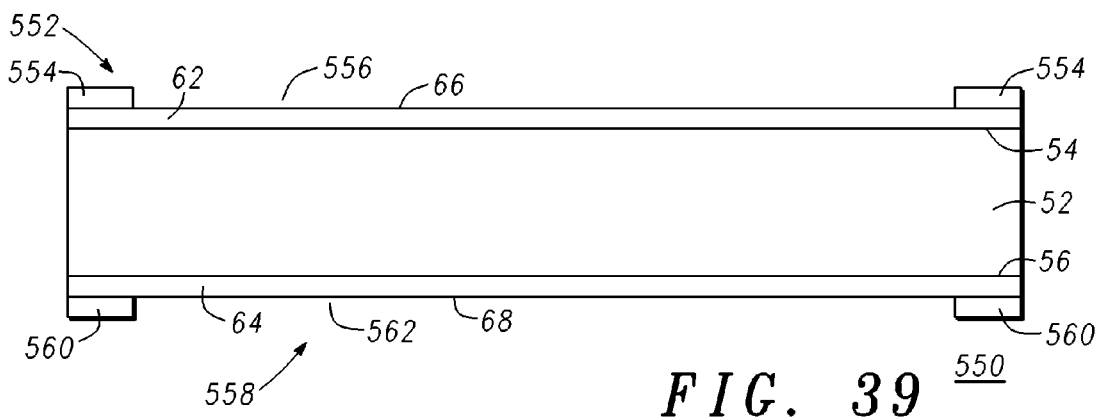
FIG. 39 is a cross-sectional view of a transient voltage suppressor at an early stage of manufacture in accordance with another embodiment of the present invention.

FIG. 39 is a cross-sectional view of a portion of a transient voltage suppressor 550 at an early stage of manufacture in accordance with another embodiment of the present invention. It should be noted that the circuit schematic and current-voltage plot for transient voltage suppressor 550 are similar to those shown and described with reference to FIGS. 24 and 25. What is shown in FIG. 39 is a semiconductor substrate 52 having surfaces 54 and 56 and dielectric layers 62 and 64 formed on surfaces 54 and 56. Semiconductor substrate 52 and dielectric layers 62 and 64 have been described with reference to FIG. 3. A layer of photoresist is formed on surface 66 of dielectric layer 62 and a layer of photoresist is formed on surface 68 of dielectric layer 64 using techniques known to those skilled in the art. The photoresist layer on surface 66 is patterned to form an etch mask 552 having masking features 554 and an opening 556 and the photoresist layer on surface 68 is patterned to form an etch mask 558 having masking features 560 and an opening 562. Opening 556 exposes a portion of dielectric layer 62 and opening 562 exposes a portion of dielectric layer 64.

Figure 40:
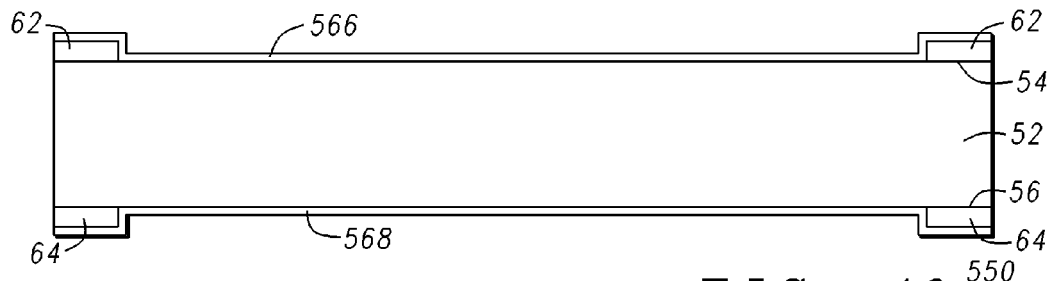
FIG. 40 is a cross-sectional view of the transient voltage suppressor of FIG. 39 at a later stage of manufacture.

Referring now to FIG. 40, the exposed portions of dielectric layers 62 and 64 are anisotropically etched using either a dry etch or a wet etch to expose portions of surfaces 54 and 56. By way of example, the exposed portions of dielectric layers 62 and 64 are etched using hydrofluoric (HF) acid. Etch masks 552 and 558 are removed and the remaining portions of dielectric layers 62 and 64 serve as doping masks or diffusion masks.

An impurity material of P type conductivity is deposited on the exposed portions of surfaces 54 and 56 of semiconductor substrate 52 to form predeposition layers 566 and 568, respectively. Predeposition layers 566 and 568 are referred to as gate predeposition layers. By way of example, the impurity material is boron and is deposited to have a resistivity ranging from about 2 Ω/square to about 400 Ω/square. Suitable sources of boron include boron trichloride, diborane, or the like. The technique for disposing the boron on surfaces 54 and 56 is not a limitation of the present invention. It may be deposited, sprayed-on, spun-on, implanted using ion implantation, or the like.

Figure 41:
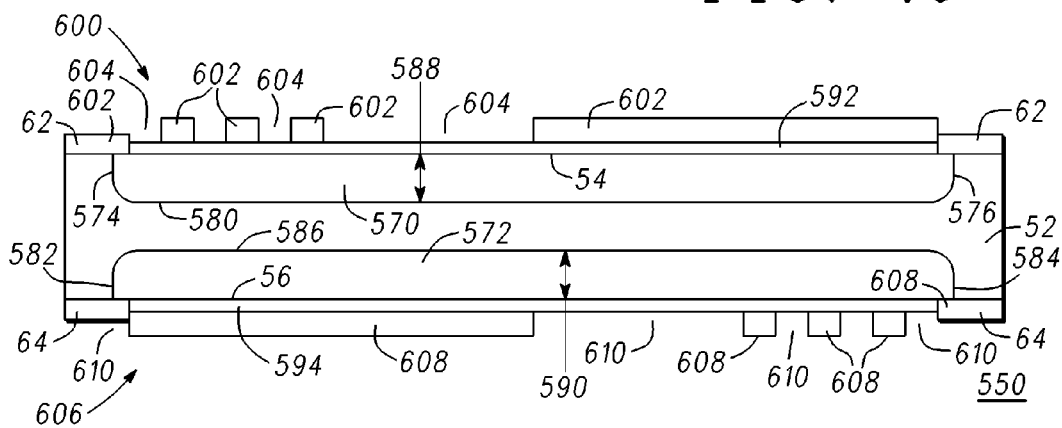
FIG. 41 is a cross-sectional view of the transient voltage suppressor of FIG. 40 at a later stage of manufacture.

Referring now to FIG. 41, the impurity material of gate predeposition layers 566 and 568 is driven into semiconductor substrate 52 to form doped regions 570 and 572, which may be referred to as gate regions. The drive-in is performed for a time ranging from about 20 hours to about 225 hours at a temperature ranging from about 1,250° C. to about 1,280° C. Doped region 570 extends from surface 54 into semiconductor substrate 52, has lateral boundaries 574 and 576, a vertical boundary 580, and serves as a gate region of transient voltage suppressor 550. Doped region 572 extends from surface 56 into semiconductor substrate 52, has lateral boundaries 582 and 584, a vertical boundary 586, and serves as another gate region of transient voltage suppressor 550. The distance from surface 54 to vertical boundary 580 represents a junction depth 588 and the distance from surface 56 to vertical boundary 586 represents a junction depth 590. Driving in predeposition layers 566 and 568, i.e., forming gate or doped regions 570 and 572 oxidizes the exposed portions of surfaces 54 and 56 thereby forming oxide or dielectric layers 592 and 594, respectively. Preferably, the thicknesses of dielectric layers 592 and 594 are greater than about 10,000 Å.

A layer of photoresist is formed on the remaining portions of dielectric layer 62 and on dielectric layer 592 and a layer of photoresist is formed on the remaining portions of dielectric layer 64 and on dielectric layer 592 using techniques known to those skilled in the art. The photoresist layer on dielectric layer 62 and dielectric layer 592 is patterned to form an etch mask 600 having masking features 602 and openings 604 and the photoresist layer on surface 68 and dielectric layer 594 is patterned to form an etch mask 606 having masking features 608 and openings 610. Openings 604 expose dielectric layer 62 and portions of dielectric layer 592 and openings 610 expose dielectric layer 64 and portions of dielectric layer 594. Etch masks 600 and 602 are also referred to as cathode etch masks or cathode masking structures.

Figure 42:
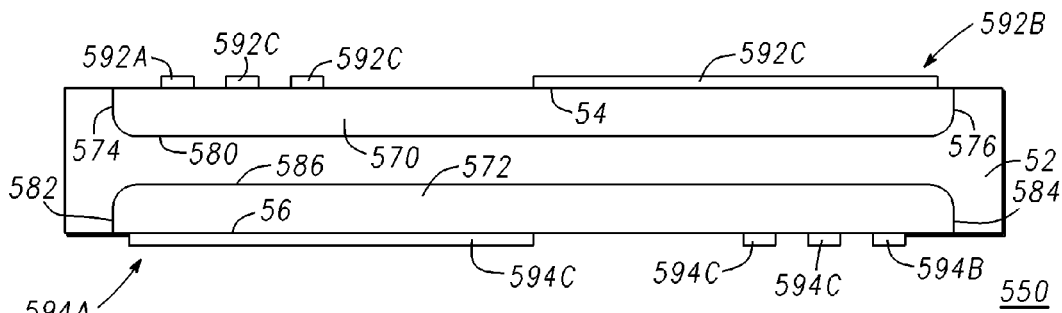
FIG. 42 is a cross-sectional view of the transient voltage suppressor of FIG. 41 at a later stage of manufacture.

Referring now to FIG. 42, the exposed portions of dielectric layers 62, 592, 64, and 594 are anisotropically etched using either a dry etch or a wet etch to expose portions of surfaces 54 and 56. By way of example, the exposed portions of dielectric layers 62 and 64 are etched using hydrofluoric (HF) acid. Masking structures 600 and 606 are removed. Etching dielectric layers 592 and 594 leaves portions 592A, 592B, and 592C of dielectric layer 592 and portions 594A, 594B, and 594C of dielectric layer 594.

Figure 43:
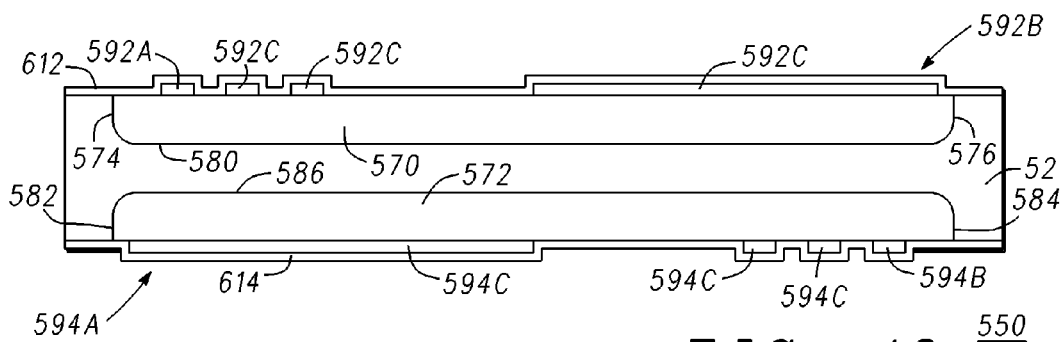
FIG. 43 is a cross-sectional view of the transient voltage suppressor of FIG. 42 at a later stage of manufacture.

Referring now to FIG. 43, an impurity material of N-type conductivity is deposited on portions 592A, 592B, and 592C of dielectric layer 592 and on the exposed portions of surface 54 to form a predeposition layer 612 and on portions 594A, 594B, and 594C of dielectric layer 594 and on the exposed portions of surface 56 to form predeposition layer 614. Predeposition layers 612 and 614 are also referred to as cathode predeposition layers because they form cathode regions during a subsequent drive-in step. By way of example, the impurity material is phosphorus or a phosphorus containing material that is deposited to have a resistivity ranging from about 100 Ω/square to about 1,000 Ω/square. Suitable sources of phosphorus include phosphorus oxytrichloride (POCl$_3$), phosphine (PH$_3$), phosphorus pentaoxide, or the like.

Figure 44:
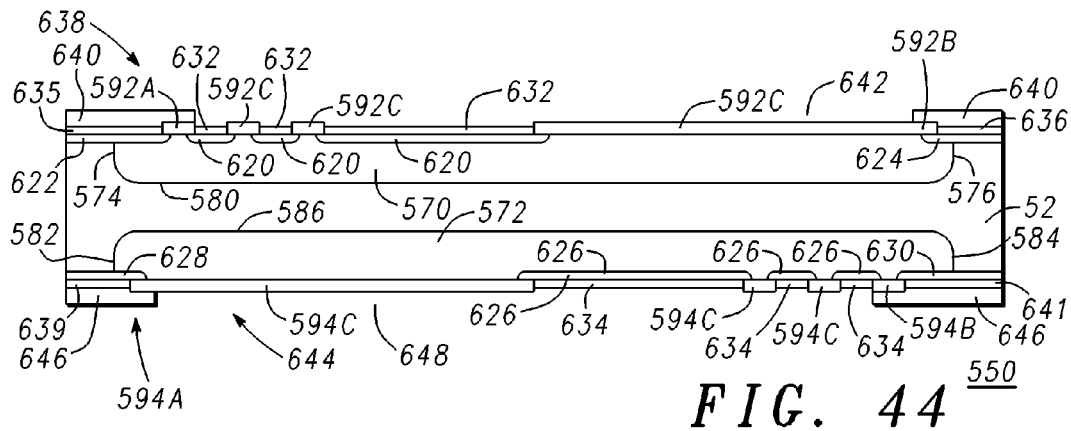
FIG. 44 is a cross-sectional view of the transient voltage suppressor of FIG. 43 at a later stage of manufacture.

Referring now to FIG. 44, the impurity materials of predeposition layers 612 and 614 are driven into Zener regions 570 and 572 to form doped regions 620, 622, 624, 626, 628, and 630. Doped regions 620 extend from surface 54 into doped region 570, doped region 622 extends from surface 54 into a portion of doped region 570 and into a portion of substrate 12 adjacent lateral boundary 574 of doped region 570, doped region 624 extends from surface 54 into a portion of doped region 570 and into a portion of substrate 52 adjacent lateral boundary 576 of doped region 570, doped regions 626 extend from surface 56 into doped region 572, doped region 628 extends from surface 56 into a portion of doped region 572 and into a portion of substrate 52 adjacent lateral boundary 582 of doped region 572, doped region 630 extends from surface 56 into a portion of doped region 572 and into a portion of substrate 52 adjacent lateral boundary 584 of doped region 572. The drive-in is performed for a time ranging from about 0.5 hours to about 7 hours at a temperature ranging from about 1,100° C. to about 1,280° C. Doped regions 620, 622, 624, 626, 628, 630 have junction depths ranging from about 4 μm to about 10 μm. The drive-in is also referred to as a source/soak. The exposed portions of surfaces 54 and 56 are oxidized to form oxide layers 632, 635, and 636 from surface 54 and oxide layers 634, 639, and 641 from surface 56. By way of example oxide layers 632, 635, 636, 634, 639, and 641 have a thickness ranging from about 2,000 Å to about 7,000 Å and are formed by oxidizing semiconductor substrate 52 for a time ranging from about 15 minutes to about 60 minutes at a temperature ranging from about 970° C. to about 1,280° C. Oxide layers 632, 635, 636, 634, 639, and 641 are thinner than portions 592A, 592B, and 592C of dielectric layer 592 and portions 594A, 594B, and 594C of dielectric layer 594. As those skilled in the art are aware, oxidizing a semiconductor material such as silicon consumes portions of the silicon. Accordingly, oxide or dielectric layers 632, 635, 636, 634, 639, and 641 extend below the respective surfaces 54 and 56. However, for the sake of clarity surfaces 54 and 56 are shown as being planar, i.e., the bottom surfaces of oxide layers 632, 635, 636, 634, 639, and 641 are shown as being planar.

Still referring to FIG. 44, a layer of photoresist is formed on dielectric layers 632, 635, and 636 and portions 592A, 592B, and 592C and patterned to form an etch mask 638 having masking features 640 and an opening 642 and a layer of photoresist is formed on dielectric layers 634, 639, and 641 and portions 594A, 594B, and 594C of dielectric layer 594 and patterned to form an etch mask 644 having masking features 646 and an opening 648. Opening 642 exposes the remaining portions of dielectric layers 632 and portions 592C of dielectric layer 592 and opening 648 exposes the remaining portions of dielectric layers 634 and portions 594C of dielectric layer 594.

Figure 45:
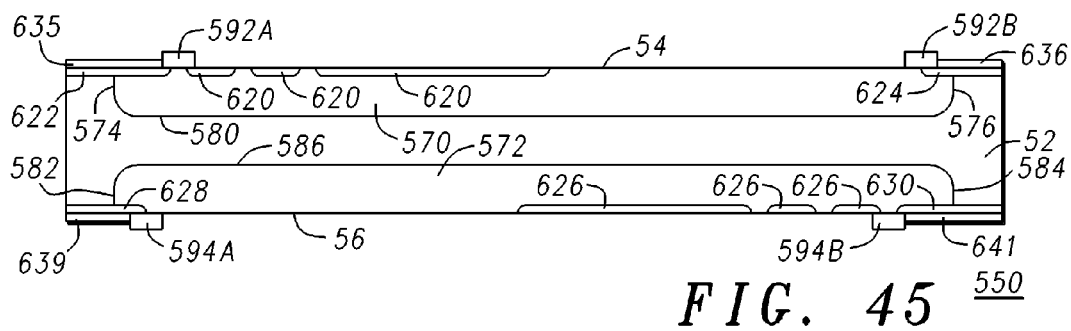
FIG. 45 is a cross-sectional view of the transient voltage suppressor of FIG. 44 at a later stage of manufacture.

Referring now to FIG. 45, the exposed portions of dielectric layers 632, 635, and 636 and portions 592C of dielectric layer 592 and the exposed portions dielectric layers 634 and portion 594C of dielectric layer 594 are anisotropically etched using either a dry etch or a wet etch to expose portions of surface 54 and portions of surface 56. By way of example, the exposed portions of dielectric layers 632 and portions 592C and the exposed portions dielectric layers 634, 639, and 641 and portions 594C are etched using hydrofluoric (HF) acid. Etch masks 638 and 644 are removed. It should be noted that portions 592A and 592B of dielectric layer 592 remain to prevent metal from contacting doped regions 622 and 624, respectively, and portions 594A and 594B of dielectric layer 594 remain to prevent metal from contacting doped regions 628 and 630, respectively.

Alternatively, passivating layers such as, for example, semi-insulating polycrystalline silicon (SIPOS), nitride, oxide, or the like may be formed on dielectric layers 640 and 646. The passivating layers are then patterned to expose dielectric layers 640 and 646.

Figure 46:
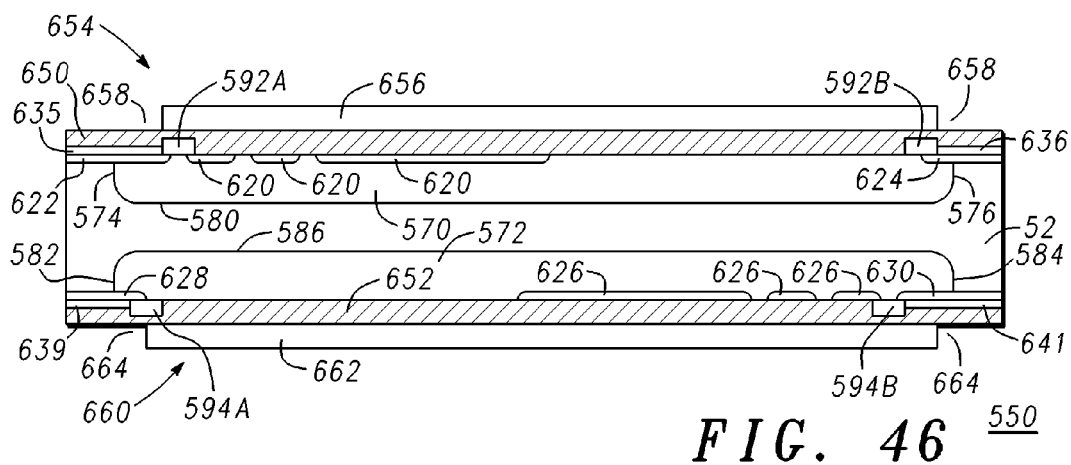
FIG. 46 is a cross-sectional view of the transient voltage suppressor of FIG. 45 at a later stage of manufacture.

Referring now to FIG. 46 a layer of aluminum 650 having a thickness ranging from about one μm to about twenty μm is formed on the dielectric layers 635 and 636 and portions 592A and 592B of dielectric layer 592 and on the exposed portions of doped regions 570, 620, 622, and 624. In addition, a layer of aluminum 652 having a thickness ranging from about one μm to about twenty μm is formed on dielectric layers 639 and 641 and portions 594A and 594B of dielectric layer 594 and on the exposed portions of doped regions 572, 626, 628, and 630. The aluminum layers may be formed by evaporation followed by sintering or by other techniques known to those skilled in the art. A layer of photoresist is formed on aluminum layer 650 and patterned to form an etch mask 654 having a masking feature 656 and openings 658 and a layer of photoresist is formed on aluminum layer 652 and patterned to form an etch mask 660 having a masking feature 662 and openings 664. Openings 658 expose the portions of aluminum layer 650 over dielectric layers 635 and 636 and openings 664 expose the portions of aluminum layer 652 over dielectric layers 639 and 641.

Figure 47:
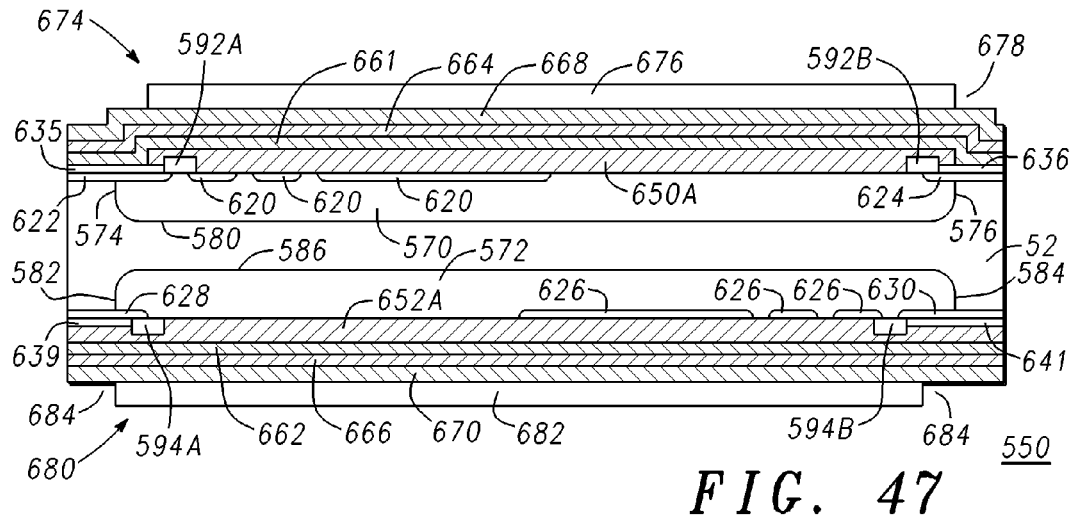
FIG. 47 is a cross-sectional view of the transient voltage suppressor of FIG. 46 at a later stage of manufacture.

Referring now to FIG. 47, the exposed portions of aluminum layer 650 are etched to expose portions of dielectric layers 635 and 636 and the exposed portions of aluminum layer 652 are etched to expose portions of dielectric layers 639 and 641. Etch masks 654 and 660 are removed. A layer of titanium 661 having a thickness ranging from about 0.1 µm to about 1 µm is formed on portion 650A of aluminum layer 650 and on the exposed portions of dielectric layers 635 and 636. A layer of titanium 662 having a thickness ranging from about 0.1 µm to about 1 µm is formed on portion 652A of aluminum layer 652 on the exposed portions of dielectric layers 639 and 641. A layer of nitride 664 is formed on titanium layer 661 and a layer of nitride 666 is formed on titanium layer 662. A layer of silver 668 is formed on nitride layer 664 and a layer of silver 670 is formed on nitride layer 666. Titanium layers 661 and 662, nitride layers 664 and 666, and silver layers 668 and 670 may be formed by evaporation or other techniques known to those skilled in the art.

A layer of photoresist is formed on silver layer 668 and patterned to form a masking structure 674 having a masking feature 676 and openings 678 that expose portions of silver layer 668 and a layer of photoresist is formed on silver layer 670 and patterned to form a masking structure 680 having a masking feature 682 and openings 684 that expose portions of silver layer 670.

Figure 48:
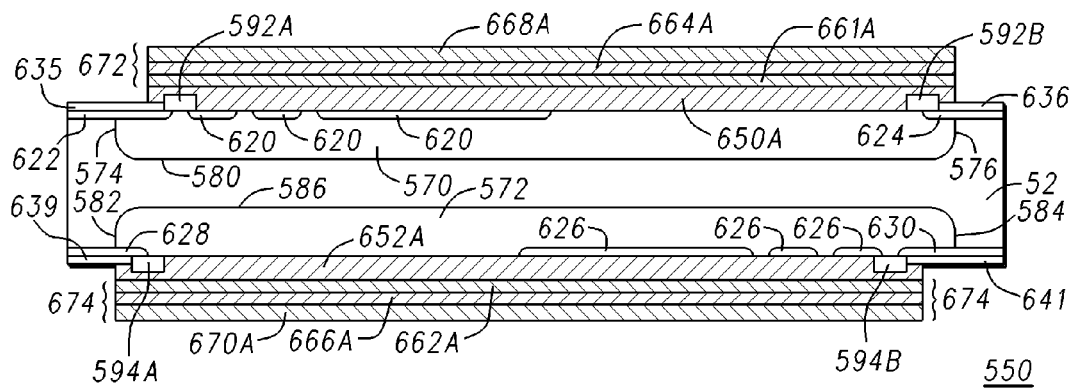
FIG. 48 is a cross-sectional view of the transient voltage suppressor of FIG. 47 at a later stage of manufacture.

Referring now to FIG. 48, the exposed portions of silver layer 668 are etched and the portions of nitride layer 664 and titanium layer 661 under the exposed portions of silver layer 668 are anisotropically etched leaving portion 668A of silver layer 668, portion 664A of nitride layer 664, and portion of 661A of titanium layer 661. The exposed portions of silver layer 670 are etched and the portions of nitride layer 666 and titanium layer 662 under the exposed portions of silver layer 670 are anisotropically etched leaving portion 670A of silver layer 670, portion 666A of nitride layer 666, and portion of 662A of titanium layer 662. Silver portion 668A, nitride portion 664A, and titanium portion 661A form a portion of a contact 672 and silver portion 670A, nitride portion 666A, and titanium portion 662A form a portion of a contact 674.

By now it should be appreciated that a transient voltage suppressor capable of providing protection against a surge event and an electrostatic discharge event have been provided. In accordance with an embodiment, the transient voltage suppressor includes a Zener diode, a PN junction diode, and a thyristor having another Zener diode coupled to its gate region, wherein the thyristor, the Zener diode and the PN junction diode are coupled in a parallel configuration. The Zener diodes may be configured to be in a horizontal orientation, a vertical orientation, or a combination of a horizontal orientation and a vertical orientation. The transient voltage suppressor is manufactured from a semiconductor substrate of a first conductivity type. A gate region of a second conductivity type is formed in the semiconductor substrate, an anode region of the second conductivity type is formed in the semiconductor substrate, and a cathode region is formed in a portion of the gate region. The anode region is spaced apart from the gate region and from the cathode region. One of the Zener diodes is under or beside the gate and cathode regions and the other Zener diode is under or beside the gate region. Thus, a localized breakdown region is under or beside the gate and cathode regions and a localized breakdown region is under or beside the gate region. One of the localized breakdown regions has a lower breakdown voltage than the breakdown voltage of the other localized breakdown region. In a horizontal configuration, the Zener diodes extend laterally or in parallel to the surface of the semiconductor substrate, in a vertical configuration the Zener diodes extend vertically or perpendicularly to the surface of the semiconductor substrate, and in a configuration that is a combination of a horizontal configuration and vertical configuration, one of the Zener diodes extends laterally or in parallel with the surface of the semiconductor substrate and the other Zener diode extends vertically or perpendicularly with the surface of the semiconductor substrate.

In addition, the thyristor portion of the transient voltage suppressor has a breakover voltage having a value that is between the values of the breakdown voltages of the Zener diodes.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A transient voltage suppressor, comprising:
   a semiconductor substrate of a first conductivity type having first and second opposing major surfaces;
   a first doped region of a second conductivity type formed from a first portion of the semiconductor substrate, the first doped region extending from the first major surface into the first portion of the semiconductor substrate and having first and second sides;
   a second doped region formed from a first portion of the first doped region, the second doped region of the first conductivity type;
   a third doped region of the first conductivity type extending into the first doped region from the first side, the third doped region and a first portion of the first doped region serving as a first localized breakdown region;
   a fourth doped region of the first conductivity type extending into the first doped region from the second side, the fourth doped region and a second portion of the first doped region serving as a second localized breakdown region; and
   a fifth doped region of the second conductivity type extending from the second major surface into the semiconductor substrate.

2. The transient voltage suppressor of claim 1, wherein the first doped region, the third doped region, and the fourth doped region cooperate with the semiconductor substrate to form a p-n junction.

3. The transient voltage suppressor of claim 1, further including:
   a sixth doped region of the second conductivity type formed from a third portion of the semiconductor substrate, the sixth doped region extending from the first major surface into the second portion of the semiconductor substrate and having first and having first and second sides, wherein the fourth doped region is between the first and sixth doped regions.

4. The transient voltage suppressor of claim 3, further including a seventh doped region formed from a third portion of the semiconductor substrate, the seventh doped region extending from the second major surface into the third portion of the fifth doped region, the seventh doped region of the first conductivity type.

5. The transient voltage suppressor of claim 4, further including an eighth doped region adjacent the second side of the sixth doped region, the eighth doped region of the first conductivity type.

6. The transient voltage suppressor of claim 5, further including at least one additional doped region of the first conductivity type formed from at least one additional portion of the first doped region.

7. The transient voltage suppressor of claim 5, further including a ninth doped region extending from the second major surface into the semiconductor substrate, the ninth doped region of the second conductivity type.

8. The transient voltage suppressor of claim 1, further including a first electrically conductive material in contact with the first and second doped regions.

9. The transient voltage suppressor of claim 8 further including a second electrically conductive material in contact with the fifth doped region.

10. The transient voltage suppressor of claim 1, further including at least one additional doped region of the first conductivity type formed from at least one additional portion of the first doped region.

11. The transient voltage suppressor of claim 1, further including at least one doped region formed in the fifth doped region, the at least one doped region of the first conductivity type.

12. A method for protecting against a surge event and an electrostatic discharge event, comprising:
providing a transient voltage suppressor comprising:
a semiconductor substrate of a first conductivity type having first and second opposing major surfaces;
a first doped region of a second conductivity type in a first portion of the semiconductor substrate, the first doped region adjacent the first major surface and having first and second sides;
a second doped region of the first conductivity type extending into the first doped region from the first side of the first doped region, the third doped region and the semiconductor substrate cooperating to form a first localized breakdown region; and
a third doped region of the first conductivity type extending into the first doped region from the second side of the first doped region, the third doped region and semiconductor substrate cooperating to form a second localized breakdown region, wherein the first doped region cooperates with the second and third doped regions and the semiconductor substrate to form a p-n junction;
engineering the first localized breakdown region to have a first breakdown voltage; and
engineering the second localized breakdown region to have a second breakdown voltage, wherein the first breakdown voltage is higher than the second breakdown voltage.

13. The method of claim 12, further including breaking down the first localized breakdown region in response to a surge event and breaking down the second localized breakdown region in response to an electrostatic discharge event.

14. A transient voltage suppressor, comprising:
a semiconductor substrate of a first conductivity type having first and second opposing major surfaces;
a first doped region of a second conductivity type in a first portion of the semiconductor substrate, the first doped region adjacent the first major surface and having first and second sides;
a second doped region of the second conductivity type in a second portion of the semiconductor substrate, the second doped region adjacent the second major surface and having first and second sides;
a third doped region of the first conductivity type extending into the first doped region from the first side of the first doped region, the third doped region and the semiconductor substrate cooperating to form a first localized breakdown region; and
a fourth doped region of the first conductivity type extending into the first doped region from the second side of the first doped region, the fourth doped region and semiconductor substrate cooperating to form a second localized breakdown region, wherein the first doped region cooperates with the third and fourth doped regions and the semiconductor substrate to form a first p-n junction.

15. The transient voltage suppressor of claim 14, further including at least one additional doped region of the first conductivity type formed in the first doped region and at least one additional doped region of the first conductivity type formed in the second doped region.

16. The transient voltage suppressor of claim 14, wherein a dopant concentration of the third and fourth doped regions is greater than a dopant concentration of the semiconductor substrate.

17. The transient voltage suppressor of claim 16, further comprising:
a fifth doped region of the second conductivity type in a third portion of the semiconductor substrate, the fifth doped region adjacent the first major surface and having first and second sides; and wherein
the fourth doped region extends into the fifth doped region from the first side of the fifth doped region.

18. The transient voltage suppressor of claim 17, further including:
a first electrically conductive material in contact with the first doped region; and
a second electrically conductive material in contact with the second doped region.

19. The transient voltage suppressor of claim 18, wherein the first electrically conductive material contacts the at least one additional doped region of the first conductivity type in the first doped region and the second electrically conductive material contacts the at least one additional doped region of the first conductivity type in the second doped region.

20. The transient voltage suppressor of claim 19, wherein the first electrically conductive material is electrically isolated from the third doped region and the second electrically conductive material electrically isolated from the fourth doped region.

* * * * *